US012575144B2

(12) United States Patent
Yang

(10) Patent No.: US 12,575,144 B2
(45) Date of Patent: Mar. 10, 2026

(54) SEMICONDUCTOR DEVICE AND MANUFACTURING METHOD THEREOF

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 371 days.

(21) Appl. No.: 18/195,354

(22) Filed: May 9, 2023

(65) Prior Publication Data

US 2024/0339495 A1 Oct. 10, 2024

(30) Foreign Application Priority Data

Apr. 7, 2023 (TW) ................................. 112113089

(51) Int. Cl.
H10D 62/10 (2025.01)
H10D 64/01 (2025.01)
H10D 84/01 (2025.01)
H10D 84/03 (2025.01)
H10D 84/83 (2025.01)

(52) U.S. Cl.
CPC ......... H10D 62/116 (2025.01); H10D 64/017 (2025.01); H10D 84/0151 (2025.01); H10D 84/038 (2025.01); H10D 84/83 (2025.01)

(58) Field of Classification Search
None
See application file for complete search history.

(56) References Cited

U.S. PATENT DOCUMENTS

| 9,704,962 | B1 | 7/2017 | Pawlak | |
| 10,847,631 | B2 | 11/2020 | Cappellani | |
| 11,322,583 | B2 | 5/2022 | Lim | |
| 11,948,990 | B2 * | 4/2024 | Yang | H10D 88/01 |
| 12,255,245 | B2 * | 3/2025 | Yang | H10D 88/01 |
| 2020/0044087 | A1 | 2/2020 | Guha | |
| 2021/0407999 | A1 | 12/2021 | Huang | |
| 2022/0216203 | A1 * | 7/2022 | Cheng | H10D 84/0151 |

* cited by examiner

*Primary Examiner* — Alexander G Ghyka
(74) *Attorney, Agent, or Firm* — Winston Hsu

(57) ABSTRACT

A semiconductor device includes a semiconductor substrate, a first semiconductor channel layer, a second semiconductor channel layer, and an isolation structure. The first semiconductor channel layer, the second semiconductor channel layer, and the isolation structure are disposed above the semiconductor substrate. The isolation structure includes a vertical portion, a first horizontal portion, and a second horizontal portion. The vertical portion is disposed between the first semiconductor channel layer and the second semiconductor channel layer in a horizontal direction. The first horizontal portion is disposed between the first semiconductor channel layer and the semiconductor substrate in a vertical direction. The second horizontal portion is disposed between the second semiconductor channel layer and the semiconductor substrate in the vertical direction. The first horizontal portion and the second horizontal portion are connected with the vertical portion.

9 Claims, 18 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including semiconductor channel layers and a manufacturing method thereof.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device using nanowires, nanosheets, or other similar structures is progressed for achieving the ongoing goals of high performance, increased miniaturization of integrated circuit components, and greater packaging density of integrated circuits. However, under the concept of the GAA, how to further improve operation performance through process and/or structural design is still the direction of continuous efforts by people in related fields.

SUMMARY OF THE INVENTION

A semiconductor device and a manufacturing method thereof are provided in the present invention. An isolation structure including horizontal portions is disposed on a semiconductor substrate for reducing off current of a semiconductor device, and related operation performance of the semiconductor device may be improved accordingly.

According to an embodiment of the present invention, a semiconductor device is provided. The semiconductor device includes a semiconductor substrate, a first semiconductor channel layer, a second semiconductor channel layer, and an isolation structure. The first semiconductor channel layer, the second semiconductor channel layer, and the isolation structure are disposed above the semiconductor substrate. The isolation structure includes a vertical portion, a first horizontal portion, and a second horizontal portion. The vertical portion is disposed between the first semiconductor channel layer and the second semiconductor channel layer in a horizontal direction. The first horizontal portion is disposed between the first semiconductor channel layer and the semiconductor substrate in a vertical direction. The second horizontal portion is disposed between the second semiconductor channel layer and the semiconductor substrate in the vertical direction. The first horizontal portion and the second horizontal portion are connected with the vertical portion.

According to an embodiment of the present invention, a manufacturing method of a semiconductor device is provided. The manufacturing method includes the following steps. A first semiconductor channel layer and a second semiconductor channel layer are formed above a semiconductor substrate. Subsequently, an isolation structure is formed above the semiconductor substrate. The isolation structure includes a vertical portion, a first horizontal portion, and a second horizontal portion. The vertical portion is disposed between the first semiconductor channel layer and the second semiconductor channel layer in a horizontal direction. The first horizontal portion is disposed between the first semiconductor channel layer and the semiconductor substrate in a vertical direction. The second horizontal portion is disposed between the second semiconductor channel layer and the semiconductor substrate in the vertical direction. The first horizontal portion and the second horizontal portion are connected with the vertical portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-13 are schematic drawings illustrating a manufacturing method of a semiconductor device according to an embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is another cross-sectional schematic diagram in the step of FIG. 10, FIG. 12 is a schematic drawing in a step subsequent to FIG. 11, and FIG. 13 is a schematic drawing in a step subsequent to FIG. 10.

FIGS. 16-18 are schematic drawings illustrating a manufacturing method of a semiconductor device according to another embodiment of the present invention, wherein FIG. 17 is a cross-sectional schematic diagram taken along a line C-C' in FIG. 16, and FIG. 18 is a cross-sectional schematic diagram taken along a line D-D' in FIG. 16.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
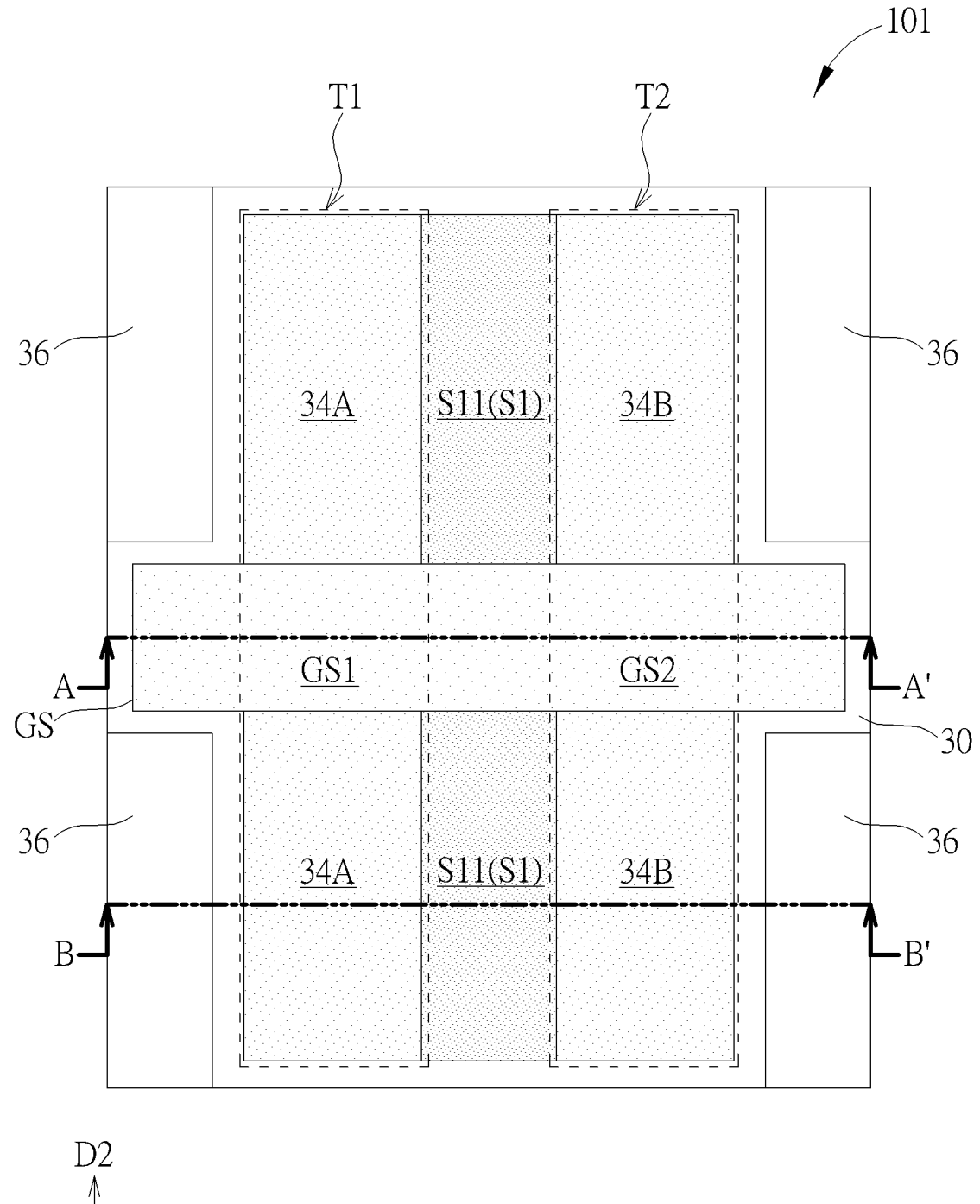
FIG. 1 is a top view schematic drawing illustrating a semiconductor device according to a first embodiment of the present invention.
Figure 2:
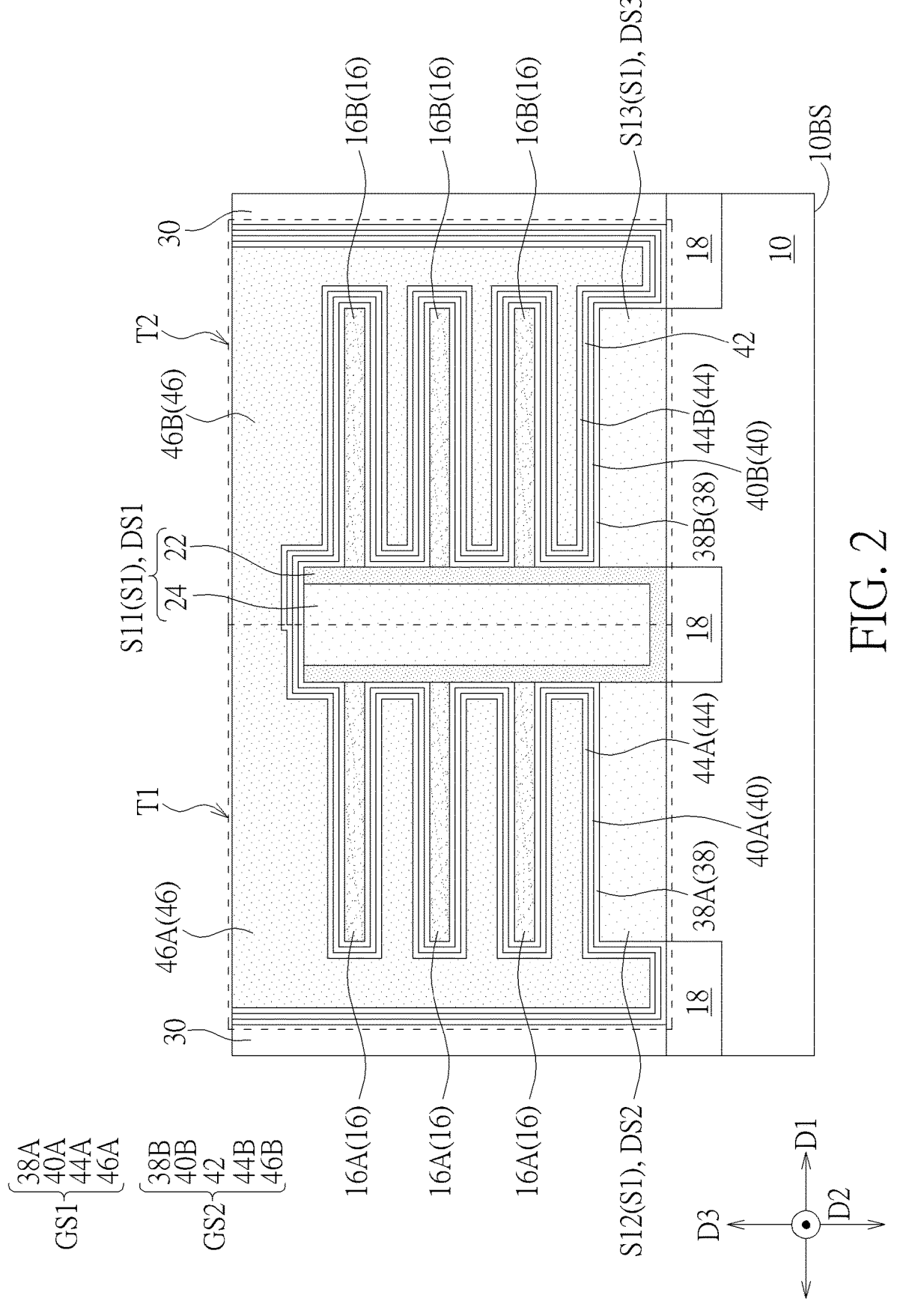
FIG. 2 is a cross-sectional schematic diagram taken along a line A-A' in FIG. 1.
Figure 3:
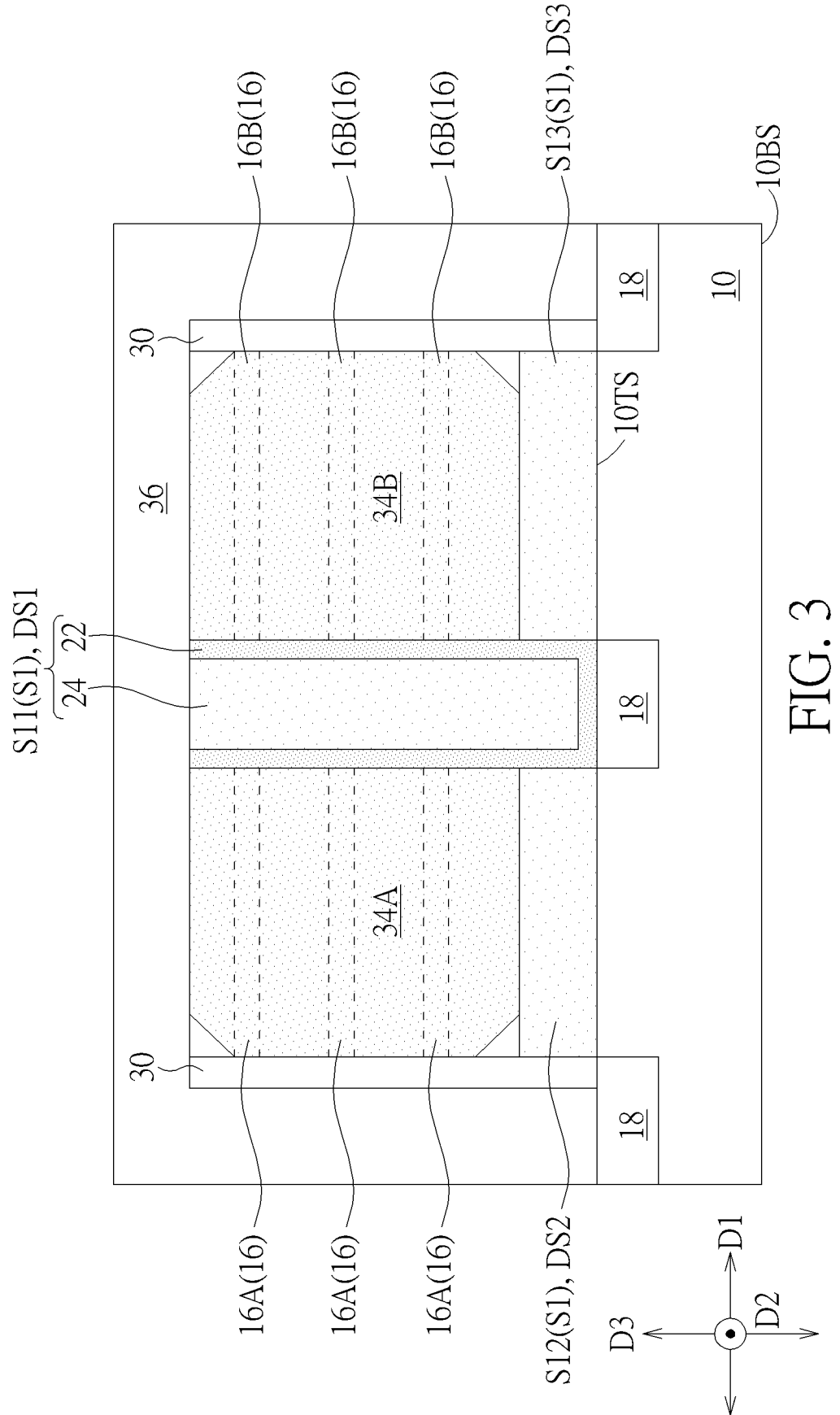
FIG. 3 is a cross-sectional schematic diagram taken along a line B-B' in FIG. 1.

Please refer to FIGS. 1-3. FIG. 1 is a top view schematic drawing illustrating a semiconductor device 101 according to a first embodiment of the present invention, FIG. 2 is a cross-sectional schematic diagram taken along a line A-A' in FIG. 1, and FIG. 3 is a cross-sectional schematic diagram taken along a line B-B' in FIG. 1. As shown in FIGS. 1-3, the semiconductor device 101 includes a semiconductor substrate 10, a first semiconductor channel layer 16A, a second semiconductor channel layer 16B, and an isolation structure S1. The first semiconductor channel layer 16A, the second semiconductor channel layer 16B, and the isolation structure S1 are disposed above the semiconductor substrate 10 in a vertical direction D3. The isolation structure S1 includes a vertical portion S11, a first horizontal portion S12, and a second horizontal portion S13. The vertical portion S11 is disposed between the first semiconductor channel layer 16A and the second semiconductor channel layer 16B in a horizontal direction D1. The first horizontal portion S12 is disposed between the first semiconductor channel layer 16A and the semiconductor substrate 10 in the vertical direction D3. The second horizontal portion S13 is disposed between the second semiconductor channel layer 16B and the semiconductor substrate 10 in the vertical direction D3. The first horizontal portion S12 and the second horizontal portion S13 are connected with the vertical portion S11. The off current of the semiconductor device 101 may be reduced by disposing the first horizontal portion S12 of the isolation structure S1 between the semiconductor substrate 10 and the first semiconductor channel layer 16A and disposing the second horizontal portion S13 of the isolation structure S1 between the semiconductor substrate 10 and the second semiconductor channel layer 16B, and related operation performance of the semiconductor device 101 may be improved accordingly. For example, the subthreshold swing (S.S.) of the semiconductor device 101 may be improved.

In some embodiments, the vertical direction D3 described above may be regarded as a thickness direction of the semiconductor substrate 10. The semiconductor substrate 10 may have a top surface 10TS and a bottom surface 10BS opposite to the top surface 10TS in the vertical direction D3, and the first semiconductor channel layer 16A, the second semiconductor channel layer, and the isolation structure S1 described above may be disposed on the side of the top surface 10TS of the semiconductor substrate 10. Horizontal directions substantially orthogonal to the vertical direction D3 (such as the horizontal direction D1, a horizontal direction D2, and other directions orthogonal to the vertical direction D3) may be substantially parallel with the top surface 10TS and/or the bottom surface 10BS of the semiconductor substrate 10, but not limited thereto. In this description, a distance between the bottom surface 10BS of the semiconductor substrate 10 and a relatively higher location and/or a relatively higher part in the vertical direction D3 is greater than a distance between the bottom surface 10BS of the semiconductor substrate 10 and a relatively lower location and/or a relatively lower part in the vertical direction D3. The bottom or lower portion of each component may be closer to the bottom surface 10BS of the semiconductor substrate 10 in the vertical direction D3 than the top or upper portion of this component. Another component disposed above a specific component may be regarded as being relatively far from the bottom surface 10BS of the semiconductor substrate 10 in the vertical direction D3, and another component disposed under a specific component may be regarded as being relatively closer to the bottom surface 10BS of the semiconductor substrate 10 in the vertical direction D3. Additionally, in this description, a top surface of a specific component may include the topmost surface of this component in the vertical direction D3, and a bottom surface of a specific component may include the bottommost surface of this component in the vertical direction D3, but not limited thereto.

In some embodiments, the semiconductor device 101 may include a plurality of the first semiconductor channel layers 16A and a plurality of the second semiconductor channel layers 16B. The first semiconductor channel layers 16A may be disposed and stacked in the vertical direction D3, and the first semiconductor channel layers 16A are separated from one another without being directly connected with one another. The second semiconductor channel layers 16B may be disposed and stacked in the vertical direction D3, and the second semiconductor channel layers 16B are separated from one another without being directly connected with one another. The first semiconductor channel layers 16A may be disposed above the first horizontal portion S12 of the isolation structure S1 in the vertical direction D3, and the second semiconductor channel layers 16B may be disposed above the second horizontal portion S13 of the isolation structure S1 in the vertical direction D3. In some embodiments, the first semiconductor channel layers 16A and the second semiconductor channel layers 16B may be disposed at two opposite sides of the vertical portion S11 of the isolation structure S1 in the horizontal direction D1, respectively. The vertical portion S11 may be partly sandwiched between the first semiconductor channel layer 16A and the corresponding second semiconductor channel layer 16B in the horizontal direction D1, and each of the first semiconductor channel layers 16A and each of the second semiconductor channel layers 16B may be directly connected with the vertical portion S11. In some embodiments, the first semiconductor channel layer 16A and the second semiconductor channel layer 16B may include a semiconductor material, such as silicon, silicon germanium, or other suitable semiconductor materials, and the first semiconductor channel layer 16A and the second semiconductor channel layer 16B may be regarded as nanosheets because of the shape and/or the dimension of the first semiconductor channel layer 16A and the second semiconductor channel layer 16B (for example, the thickness may range from 5 nanometers to 100 nanometers, but not limited thereto), but not limited thereto. In addition, a material composition of the vertical portion S11 of the isolation structure S1 may be identical to or different from a material composition of the first horizontal portion S12 and a material composition of the second horizontal portion S13 according to some design considerations. In some embodiments, the vertical portion S11, the first horizontal portion S12, and the second horizontal portion S13 of the isolation structure S1 may include an insulating material, such as an oxide insulating material (such as silicon oxide, but not limited thereto), a nitride insulating material (such as silicon nitride, but not limited thereto), a low dielectric constant (low-k) dielectric material (such as a dielectric material having dielectric constant lower than 2.7, but not limited thereto), or other suitable insulating materials. In some embodiments, the vertical portion S11 may include a dielectric layer 22 and a dielectric layer 24. The dielectric layer 24 may be disposed on the dielectric layer 22, the dielectric layer 22 may have an U-shaped structure surrounding the dielectric layer 24 in horizontal directions in a cross-sectional view of the semiconductor device 101, and a material composition of the dielectric layer 22 may be different from that of the dielectric layer 24 (for example, may be a nitride insulating material and an oxide insulating material, respectively), but not limited thereto.

In some embodiments, the semiconductor substrate 10 may include a silicon substrate, an epitaxial silicon substrate, a silicon germanium substrate, a silicon carbide substrate, or a silicon-on-insulator (SOI) substrate, but not limited thereto. In addition, the semiconductor device 101 may further include a trench isolation structure 18 disposed in the semiconductor substrate 10 for isolating regions located corresponding to different transistors in the semiconductor substrate 10, and the trench isolation structure 18 may include a single layer or multiple layers of insulating materials, such as oxide insulating materials (such as silicon oxide) or other suitable insulating materials. In some embodiments, a portion of the trench isolation structure 18 may be located under the vertical portion S11 of the isolation structure S1 in the vertical direction D3, but not limited thereto. In addition, the semiconductor device 101 may further include a first gate structure GS1 and a second gate structure GS2 disposed above the semiconductor substrate 10, the first gate structure GS1 may encompass each of the first semiconductor channel layers 16A, and the second gate structure GS2 may encompass each of the second semiconductor channel layers 16B. A portion of the first gate structure GS1 may be sandwiched between two of the first semiconductor channel layers 16A located adjacent to each other in the vertical direction D3, another portion of the first gate structure GS1 may be sandwiched between the bottommost first semiconductor channel layer 16A and the first horizontal portion S12 of the isolation structure S1 in the vertical direction D3, and further another portion of the first gate structure GS1 may be disposed above the topmost first semiconductor channel layer 16A and the vertical portion S11 of the isolation structure S1 in the vertical direction D3. Similarly, a portion of the second gate structure GS2 may be sandwiched between two of the second semiconductor channel layers 16B located adjacent to each other in the vertical direction D3, another portion of the second gate structure GS2 may be sandwiched between the bottommost second semiconductor channel layer 16B and the second horizontal portion S13 of the isolation structure S1 in the vertical direction D3, and further another portion of the second gate structure GS2 may be disposed above the topmost second semiconductor channel layer 16B and the vertical portion S11 of the isolation structure S1 in the vertical direction D3.

In some embodiments, the first gate structure GS1 and the second gate structure GS2 may be connected with each other, and a material composition of the first gate structure GS1 may be different from a material composition of the second gate structure GS2, but not limited thereto. For example, the first gate structure GS1 may include a first portion 38A of an interfacial layer 38, a first portion 40A of a dielectric layer 40, a first portion 44A of a second work function layer 44, and a first portion 46A of an electrically conductive layer 46 disposed and stacked sequentially, and the second gate structure GS2 may include a second portion 38B of the interfacial layer 38, a second portion 40B of the dielectric layer 40, a first work function layer 42, a second portion 44B of the second work function layer 44, and a second portion 46B of the electrically conductive layer 46 disposed and stacked sequentially. The interfacial layer 38 may include an oxide dielectric material or other suitable dielectric materials, and the first portion 38A and the second portion 38B of the interfacial layer 38 may be directly connected with each other. The dielectric layer 40 may include a single layer or multiple layers of high dielectric constant (high-k) dielectric materials or other suitable dielectric materials, and the first portion 40A and the second portion 40B of the dielectric layer 40 may be directly connected with each other. The above-mentioned high-k dielectric materials may include hafnium oxide ($HfO_x$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials. The first work function layer 42 and the second work function layer 44 may include titanium nitride (TiN), titanium carbide (TIC), tantalum nitride (TaN), tantalum carbide (TaC), tungsten carbide (WC), titanium trialuminide ($TiAl_3$), aluminum titanium nitride (TiAlN), or other suitable electrically conductive work function materials. A material composition of the first work function layer 42 may be different from a material composition of the second work function layer 44, and the first portion 44A and the second portion 44B of the second work function layer 44 may be directly connected with each other. The electrically conductive layer 46 may include metallic electrically conductive materials, such as tungsten, aluminum, copper, titanium aluminide, titanium, or other suitable electrically conductive materials with relatively low electrical resistivity, and the first portion 46A and the second portion 46B of the electrically conductive layer 46 may be directly connected with each other.

In some embodiments, the semiconductor device 101 may further include a first source/drain structure 34A and a second source/drain structure 34B. The first source/drain structure 34A may be disposed above the first horizontal portion S12 of the isolation structure S1, the second source/drain structure 34B may be disposed above the second horizontal portion S13 of the isolation structure S1, and the vertical portion S11 of the isolation structure S1 may be partly disposed between and/or sandwiched between the first source/drain structure 34A and the second source/drain structure 34B in the horizontal direction D1. In addition, the first source/drain structure 34A may be directly connected with each of the first semiconductor channel layers 16A, and the second source/drain structure 34B may be directly connected with each of the second semiconductor channel layers 16B. In some embodiments, the semiconductor device 101 may include two first source/drain structures 34A and two second source/drain structures 34B. The two first source/drain structures 34A may be disposed at two opposite sides of the first gate structure GS1 in the horizontal direction D2, respectively, the two second source/drain structures 34B may be disposed at two opposite sides of the second gate structure GS2 in the horizontal direction D2, respectively, and the horizontal direction D2 may be substantially orthogonal to the horizontal direction D1, but not limited thereto.

In some embodiments, the first gate structure GS1, the first semiconductor channel layers 16A, and the two first source/drain structures 34A may be at least a portion of a transistor T1, the second gate structure GS2, the second semiconductor channel layers 16B, and the two second source/drain structures 34B may be at least a portion of a transistor T2, and the vertical portion S11 of the isolation structure S1 may be used to isolate the semiconductor channel layer and the source/drain structure of the transistor T1 from the semiconductor channel layer and the source/drain structure of the transistor T2. In some embodiments, the transistor T1 and the transistor T2 may be respectively regarded as a gate-all-around (GAA) transistor structure, but not limited thereto. In some embodiments, the first source/drain structure 34A and the second source/drain structure 34B may include epitaxial materials, such as epitaxial silicon, epitaxial silicon germanium (SiGe), epitaxial silicon phosphide (SiP), or other suitable epitaxial materials, and a material composition of the first source/drain structure 34A may be different from a material composition of the second source/drain structure 34B especially when the transistor T1 and the transistor T2 are different types of transistor structures. For example, the transistor T1 may be an n-type field effect transistor, the transistor T2 may be a p-type field effect transistor, the first work function layer 42 may be a p-type work function layer, the first source/drain structure 34A may include epitaxial silicon phosphide, and the second source/drain structure 34B may include epitaxial silicon germanium, but not limited thereto. In some embodiments, electrically conductive silicide layers (not illustrated) may be disposed on the surface of the first source/drain structure 34A and the surface of the second source/drain structure 34B, respectively, according to some design considerations for improving the electrical connection between the source/drain structure and a corresponding contact structure (not illustrated).

In some embodiments, the semiconductor device 101 may further include a spacer structure 30 and a dielectric layer 36. The spacer structure 30 and the dielectric layer 36 may be disposed above the semiconductor substrate 10, the spacer structure 30 may be located on a sidewall of the first gate structure GS1, a sidewall of the second gate structure GS2, a sidewall of the first source/drain structure 34A, and a sidewall of the second source/drain structure 34B, and the dielectric layer 36 may cover the spacer structure 30, the first source/drain structure 34A, the second source/drain structure 34B, and a part of the vertical portion S11 of the isolation structure S1. The spacer structure 30 may include a single layer or multiple layers of insulating materials, such as silicon oxide, silicon nitride, silicon oxynitride, or other suitable insulating materials, and the dielectric layer 36 may include silicon oxide, silicon nitride, silicon oxynitride, low-k dielectric materials, or other suitable dielectric materials. In a top view diagram of the semiconductor device 101 (such as FIG. 1), the first gate structure GS1 and the second gate structure GS2 may be different portions of a gate structure GS elongated in the horizontal direction D1, the vertical portion S11 of the isolation structure S1 may be elongated in the horizontal direction D2, and the gate structure GS may be disposed straddling the vertical portion S11 of the isolation structure S1. In addition, as shown in FIG. 2, a portion of the first gate structure GS1 may be sandwiched between the spacer structure 30 and the first horizontal portion S12 of the isolation structure S1 in the horizontal direction D1, and a portion of the second gate structure GS2 may be sandwiched between the spacer structure 30 and the second horizontal portion S13 of the isolation structure S1 in the horizontal direction D1. In some embodiments, the first gate structure GS1 sandwiched between the spacer structure 30 and the first horizontal portion S12 in the horizontal direction D1 and the second gate structure GS2 sandwiched between the spacer structure 30 and the second horizontal portion S13 in the horizontal direction D1 may be disposed above the trench isolation structure 18. The first horizontal portion S12 and the second horizontal portion S13 of the isolation structure S1 may be used to provide isolation effect between the first gate structure GS1 and the semiconductor substrate 10 and isolation effect between the second gate structure GS2 and the semiconductor substrate 10, respectively. Therefore, the leakage current between the transistor T1 and the semiconductor substrate 10 may be reduced by the first horizontal portion S12, the leakage current between the transistor T2 and the semiconductor substrate 10 may be reduced by the second horizontal portion S13, and the related operation performance of the semiconductor device 101 may be improved accordingly.

Figure 4:
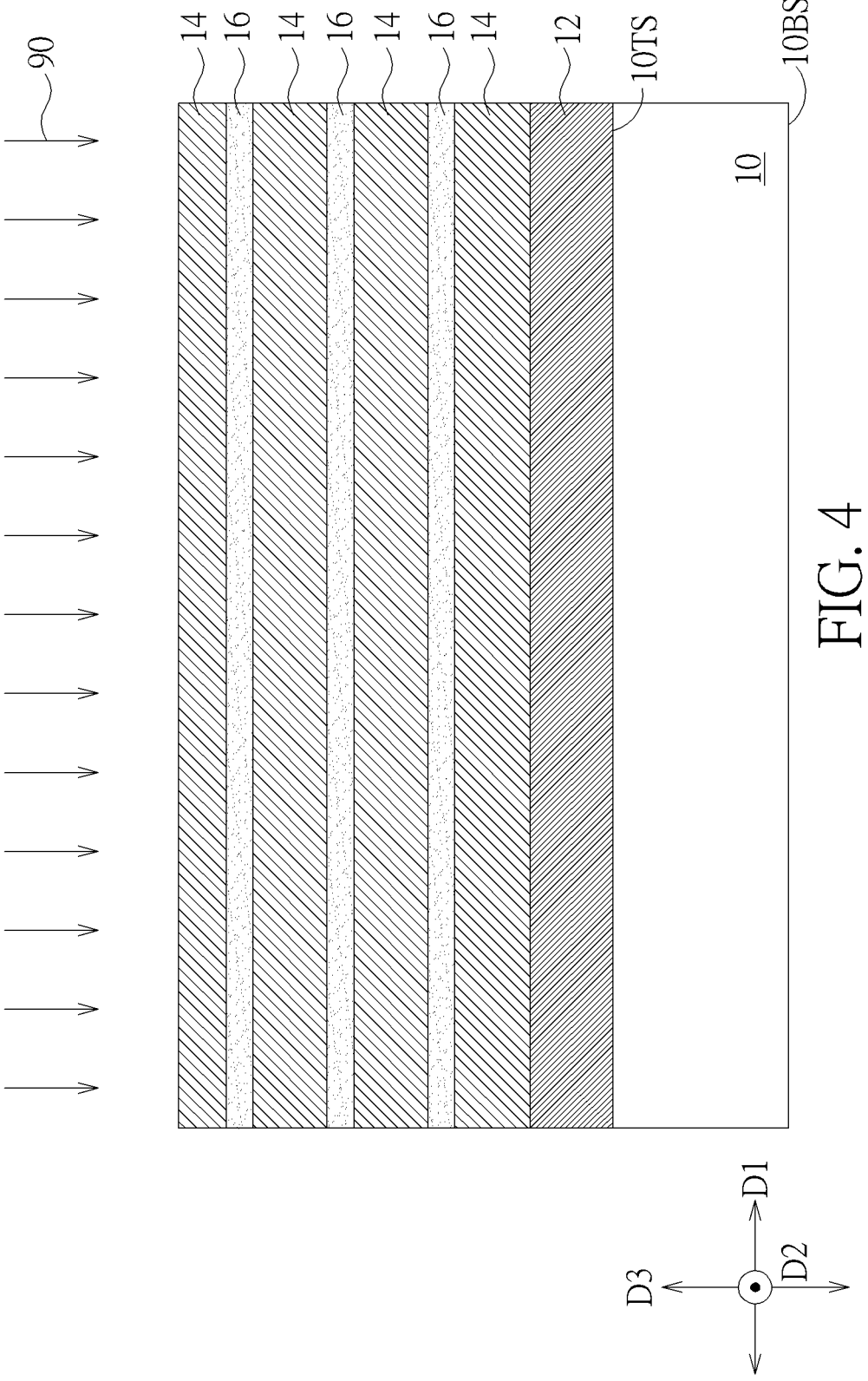
Figure 5:
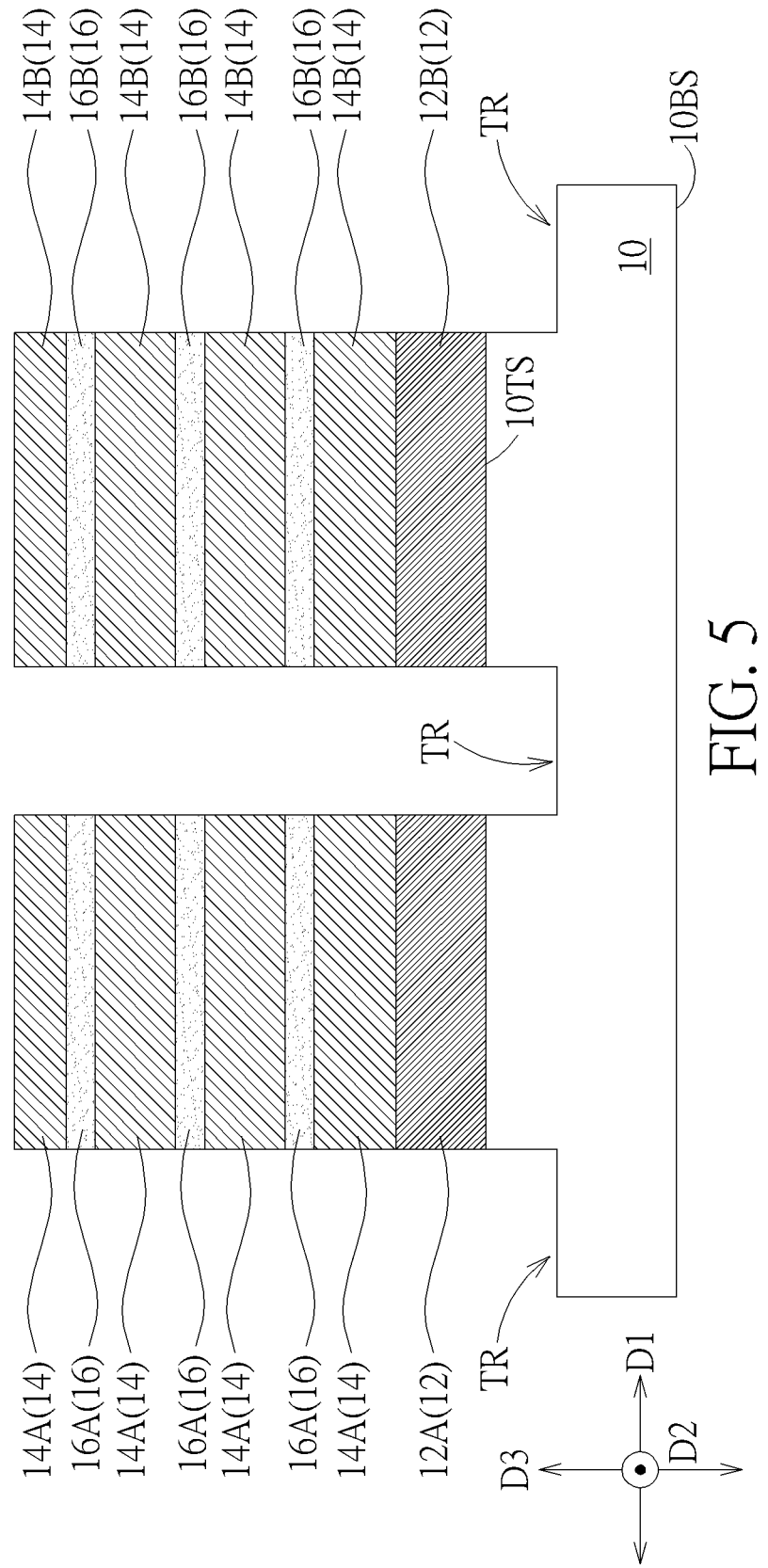
Figure 6:
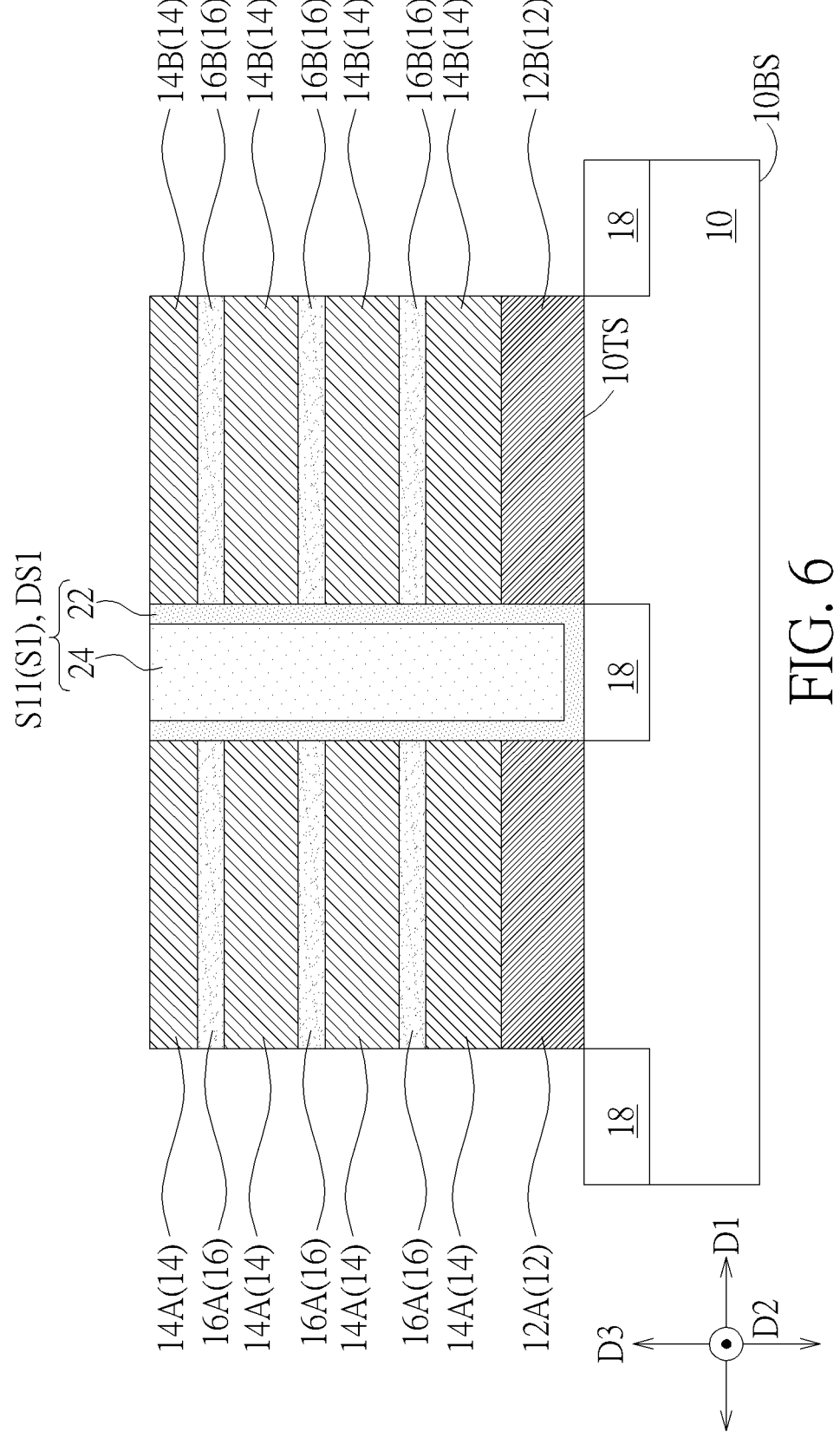
Figure 7:
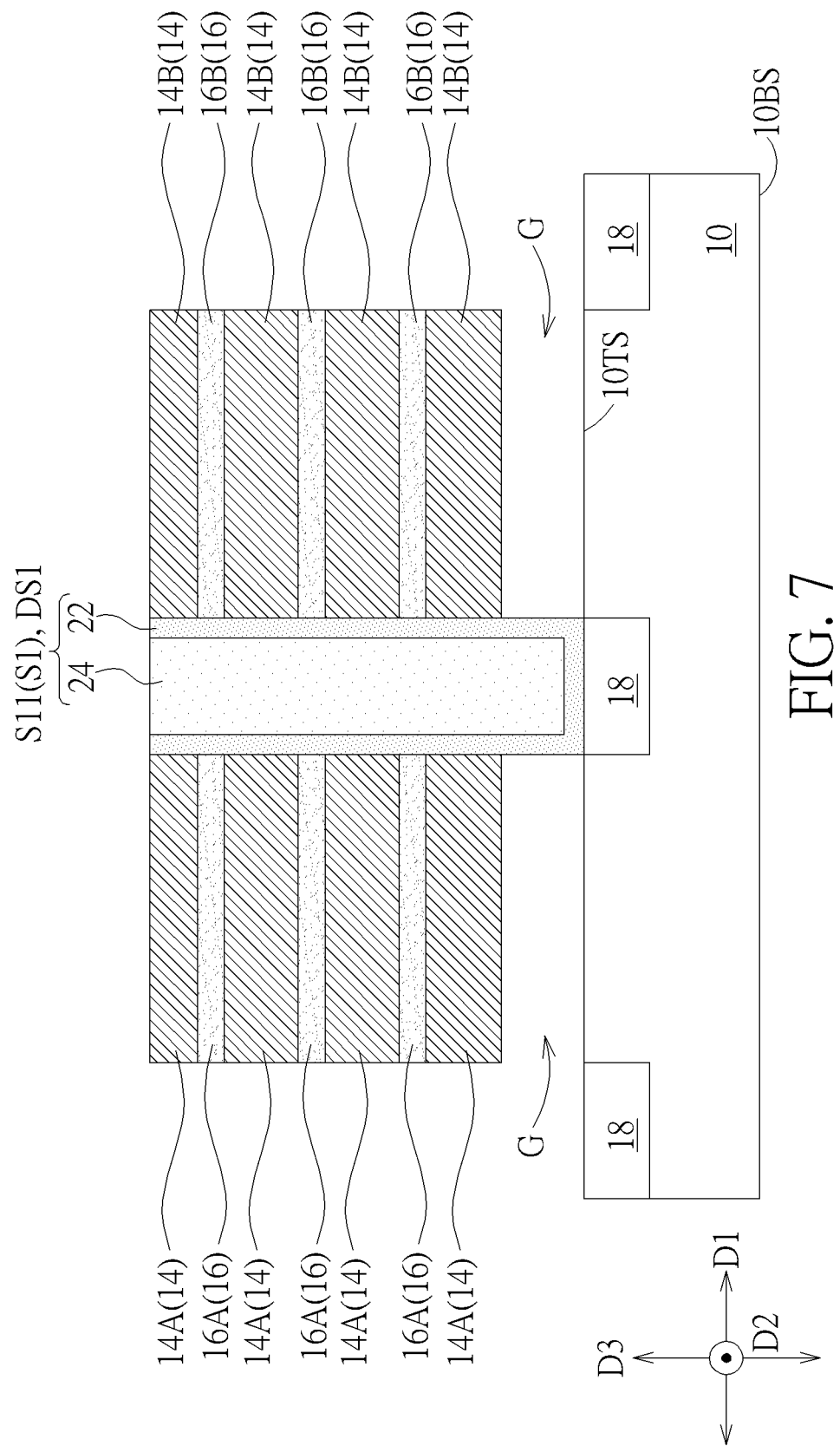
Figure 8:
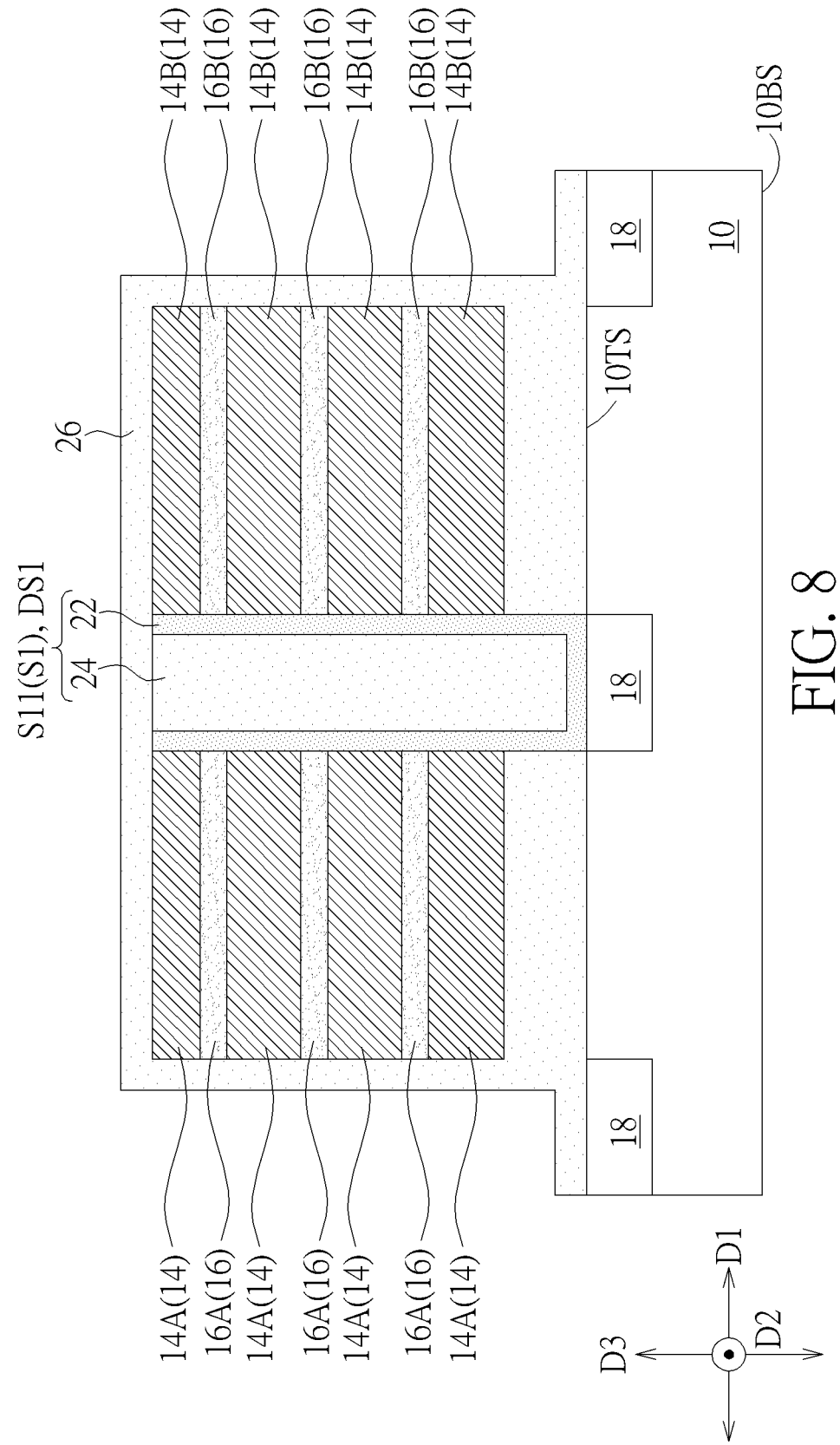
Figure 9:
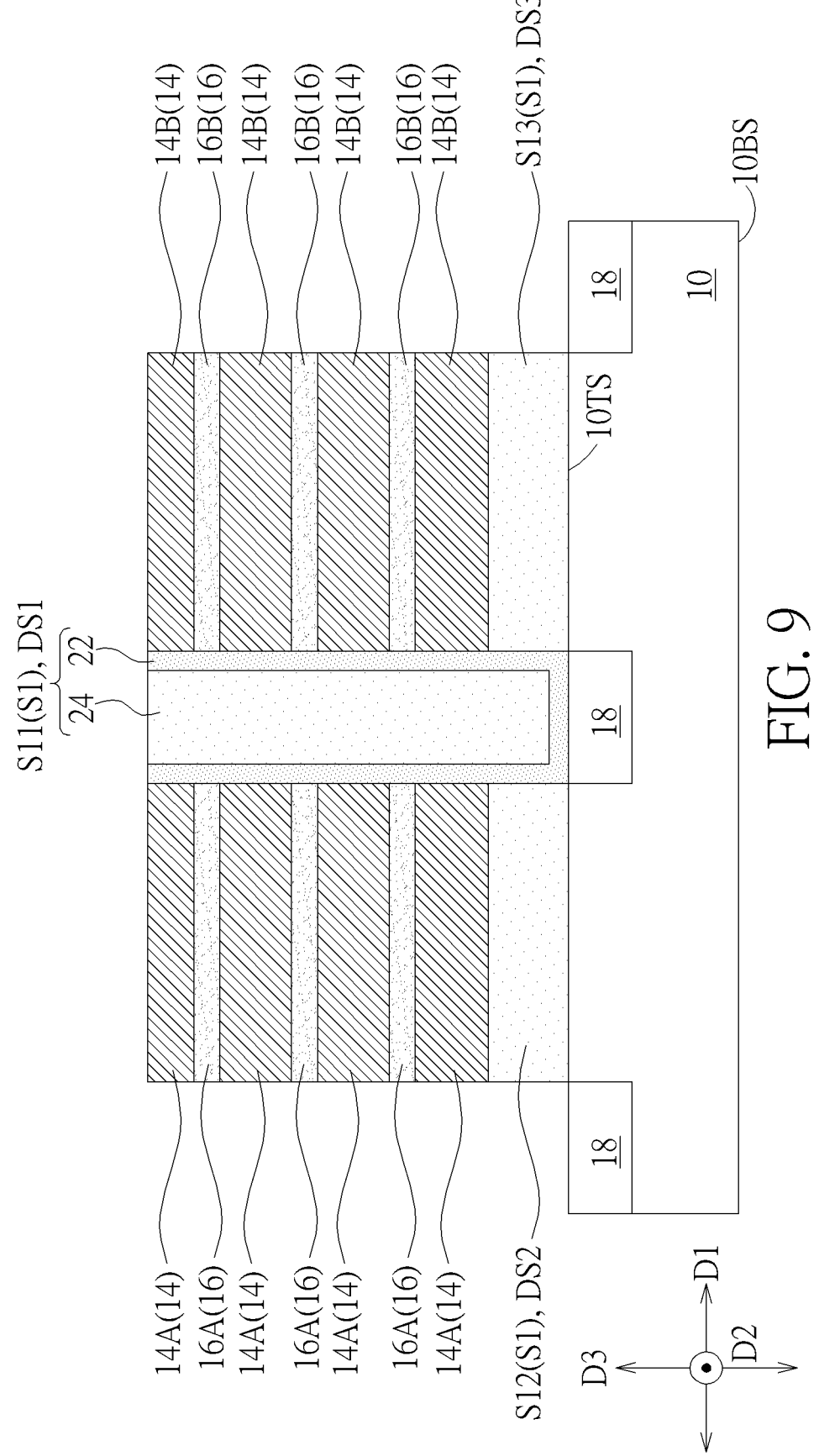
Figure 10:
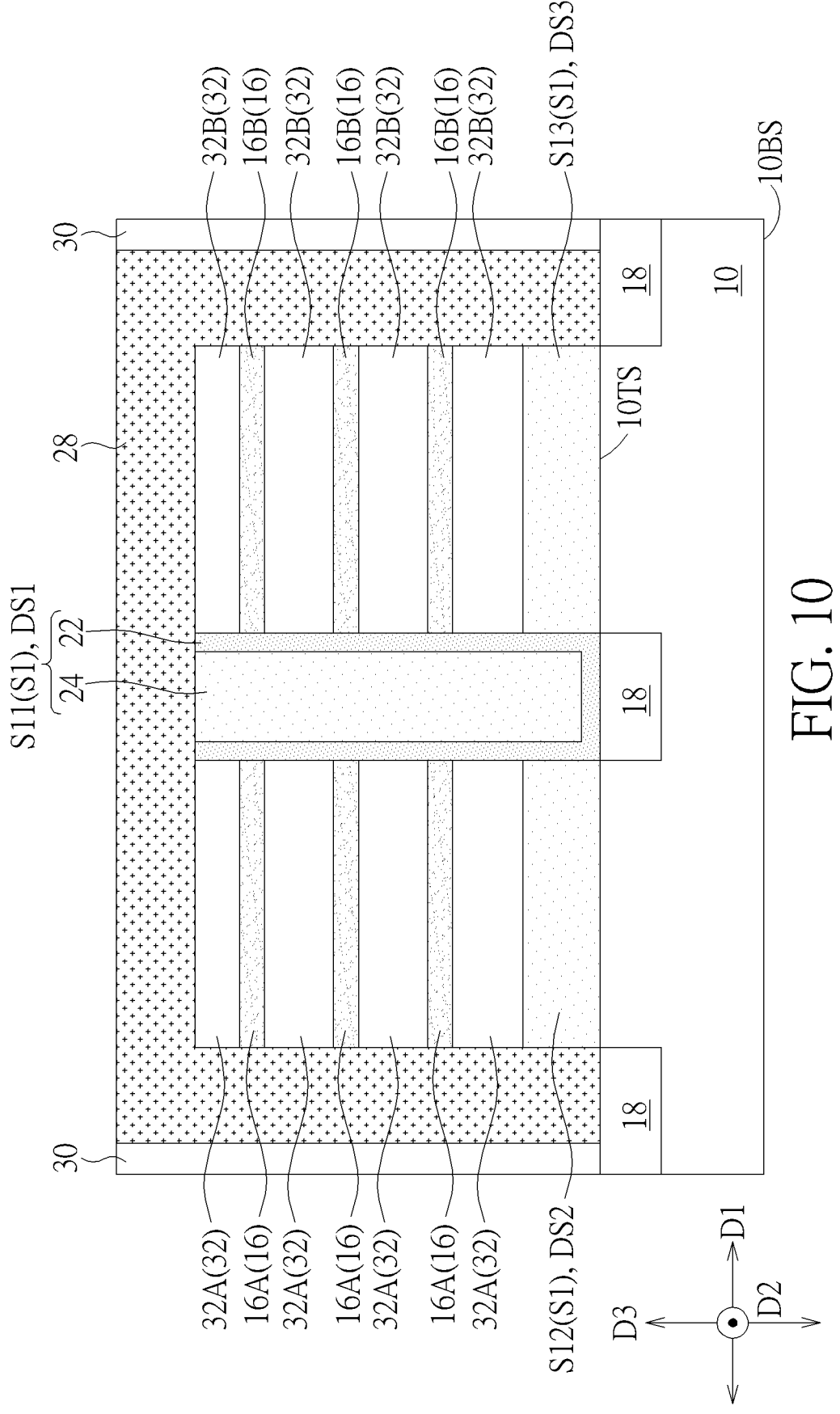
Figure 11:
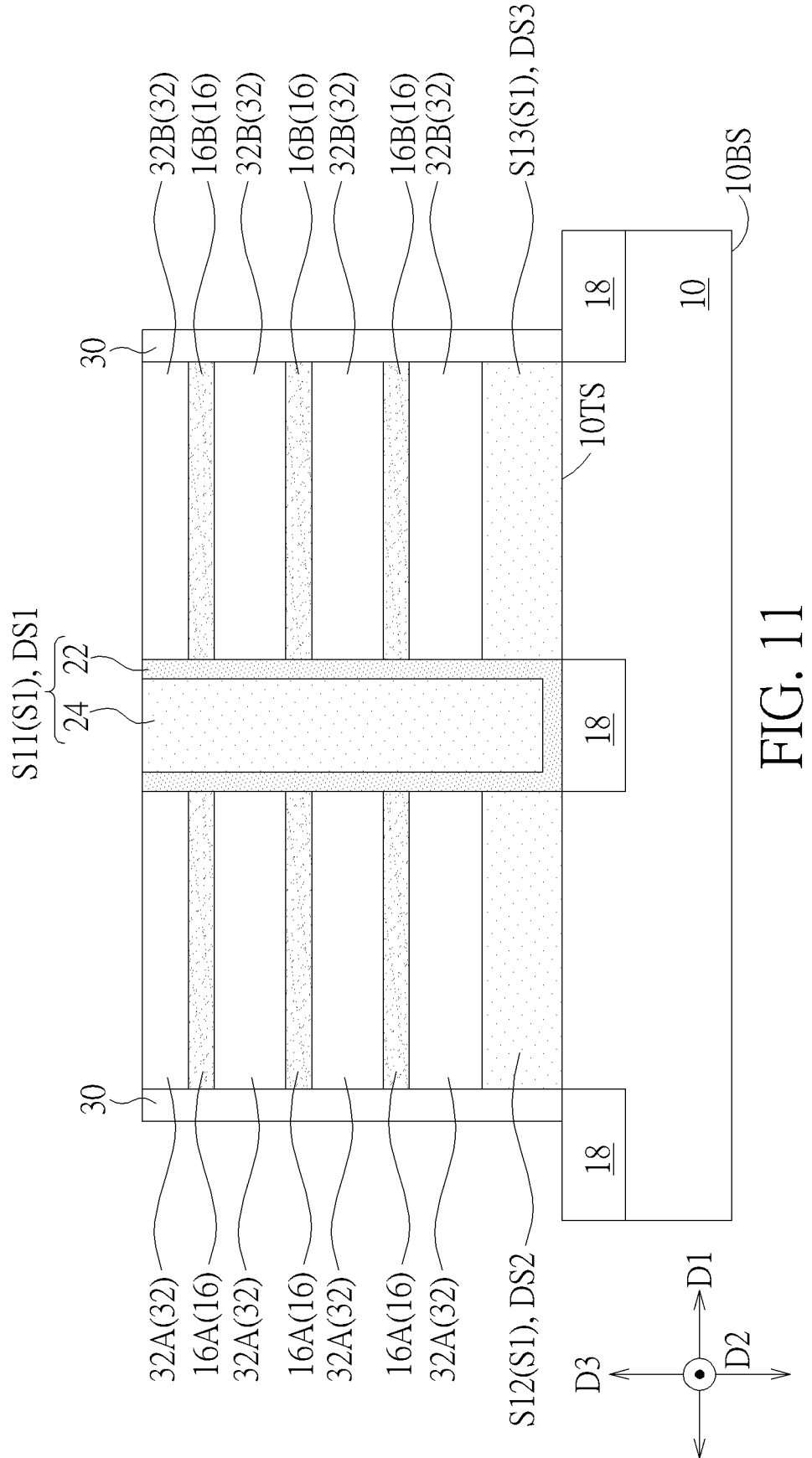
Figure 12:
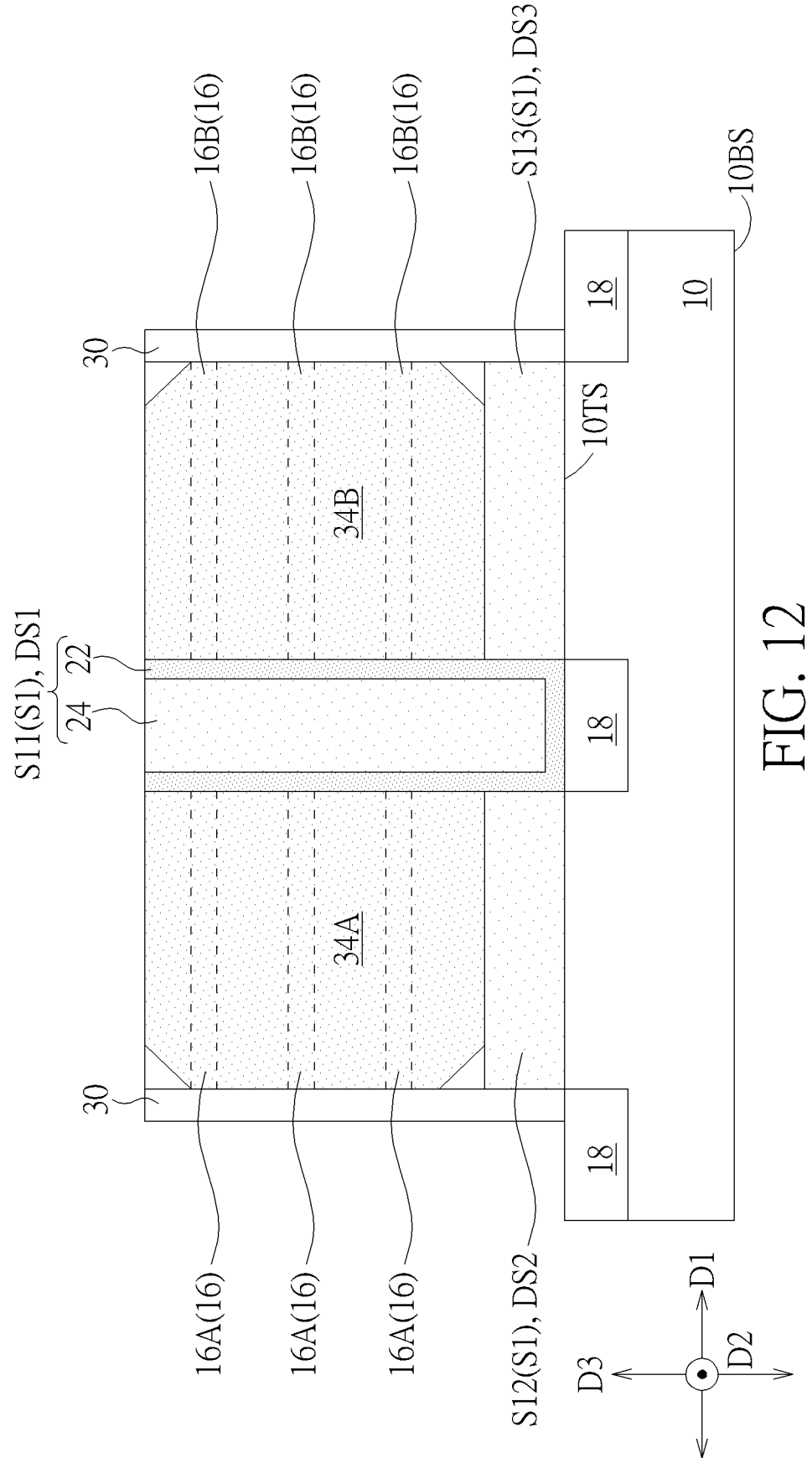
Figure 13:
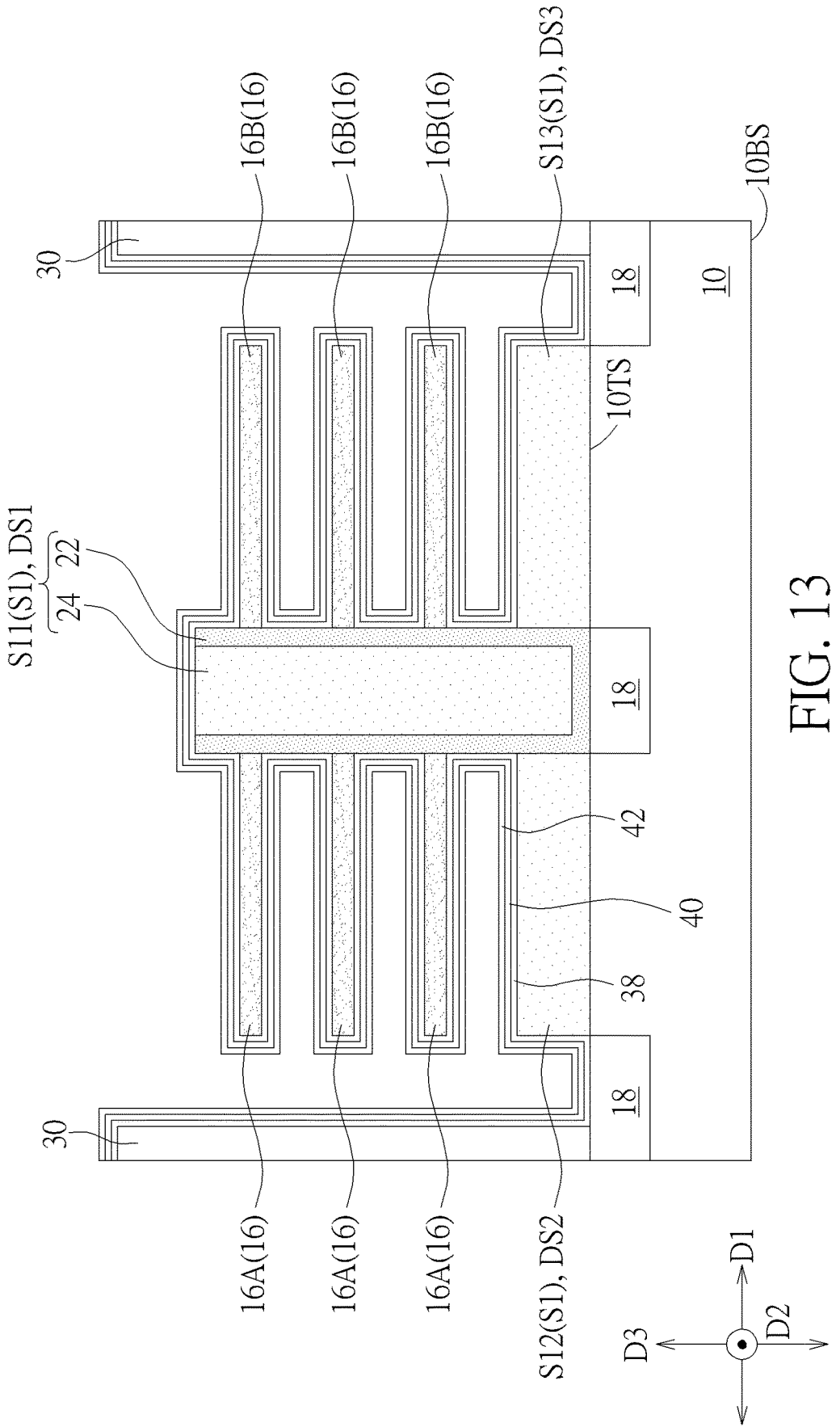

Please refer to FIGS. 4-13 and FIGS. 1-3. FIGS. 4-13 are schematic drawings illustrating a manufacturing method of a semiconductor device according to an embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is another cross-sectional schematic diagram in the step of FIG. 10, FIG. 12 is a schematic drawing in a step subsequent to FIG. 11, and FIG. 13 is a schematic drawing in a step subsequent to FIG. 10. In some embodiments, FIG. 2 may be regarded as a schematic drawing in a step subsequent to FIG. 13, and FIG. 3 may be regarded as a schematic drawing in a step subsequent to FIG. 12, but not limited thereto. As shown in FIGS. 1-3, the manufacturing method in this embodiment may include the following steps. The first semiconductor channel layer 16A and the second semiconductor channel layer 16B are formed above the semiconductor substrate 10, and the isolation structure S1 is formed above the semiconductor substrate 10. The isolation structure S1 includes the vertical portion S11, the first horizontal portion S12, and the second horizontal portion S13. The vertical portion S11 is disposed between the first semiconductor channel layer 16A and the second semiconductor channel layer 16B in the horizontal direction D1. The first horizontal portion S12 is disposed between the first semiconductor channel layer 16A and the semiconductor substrate 10 in the vertical direction D3. The second horizontal portion S13 is disposed between the second semiconductor channel layer 16B and the semiconductor substrate 10 in the vertical direction D3. The first horizontal portion S12 and the second horizontal portion S13 are connected with the vertical portion S11.

Specifically, the manufacturing method in this embodiment may include but is not limited to the following steps. As shown in FIG. 4, a first sacrificial layer 12 may be formed on the top surface 10TS of the semiconductor substrate 10, a plurality of second sacrificial layers 14 and a plurality of semiconductor layers 16 alternately stacked may be formed on the first sacrificial layer 12 after the first sacrificial layer 12 is formed, and each of the semiconductor layers 16 may be located above at least one of the second sacrificial layers 14. In some embodiments, one of the second sacrificial layers 14 may be disposed between two of the semiconductor layers 16 adjacent to each other in the vertical direction D3, one of the second sacrificial layers 14 may be disposed between the bottommost semiconductor layer 16 and the first sacrificial layer 12, and one of the second sacrificial layers 14 may be disposed above the topmost semiconductor layer 16, but not limited thereto. In some embodiments, the semiconductor layer 16 may include silicon, silicon germanium, or other suitable semiconductor materials. A material composition of the semiconductor layer 16 is different from a material composition of the second sacrificial layer 14, and the material composition of the second sacrificial layer 14 may be different from that of the first sacrificial layer 12 for providing required etching selectivity in the subsequent processes, but not limited thereto. For example, the semiconductor layer 16 may be a semiconductor silicon layer, and the first sacrificial layer 12 and the second sacrificial layer 14 may be silicon germanium material layers with different material composition ratios or other suitable sacrificial materials. For instance, the chemical formula of the material of the first sacrificial layer 12 may be $Si_{1-x}Ge_x$, and the chemical formula of the material of the second sacrificial layer 14 may be $Si_{1-y}Ge_y$, wherein x is greater than 0.5 and y is less than 0.3, but not limited thereto. Additionally, in some embodiments, the thickness of each of the semiconductor layers 16 may range from 2 nanometers to 5 nanometers, and the thickness of the first sacrificial layer 12 and the thickness of the second sacrificial layer 14 may be adjusted according to some design considerations, such as ranging from 2 nanometers to 5 nanometers, ranging from 5 nanometers to 8 nanometers, or ranging from 10 nanometers to 30 nanometers, but not limited thereto.

As shown in FIG. 4 and FIG. 5, a patterning process 90 may be performed. In some embodiments, the patterning process 90 may include forming a mask pattern (not illustrated) on the topmost semiconductor layer 16 and one or more etching steps using the mask pattern as the etching mask for etching the second sacrificial layer 14, the semiconductor layer 16, the first sacrificial layer 12, and the semiconductor substrate 10 for achieving the patterning effect, but not limited thereto. At least a part of each of the second sacrificial layer 14 may be patterned to be a first portion 14A and a second portion 14B separated from each other by the patterning process 90, at least a part of each of the semiconductor layer 16 may be patterned to be the first semiconductor channel layer 16A and the second semiconductor channel layer 16B separated from each other by the patterning process 90, and at least a part of the first sacrificial layer 12 may be patterned to be a first sacrificial pattern 12A and a second sacrificial pattern 12B separated from each other by the patterning process 90. In some embodiments, the first portions 14A of the second sacrificial layer 14 and the first semiconductor channel layers 16A may be disposed alternately on the first sacrificial pattern 12A in the vertical direction D3, and the second portions 14B of the second sacrificial layer 14 and the second semiconductor channel layers 16B may be disposed alternately on the second sacrificial pattern 12B in the vertical direction D3. In some embodiments, a portion of the semiconductor substrate 10 may be removed by the patterning process 90 for forming a trench TR in the semiconductor substrate 10, but not limited thereto. It is worth noting that the method of forming the first semiconductor channel layer 16A and the second semiconductor channel layer 16B in this invention may include but is not limited to the steps described above, and other suitable approaches may be used to form the first semiconductor channel layer 16A and the second semiconductor channel layer 16B according to some design considerations.

As shown in FIG. 5 and FIG. 6, the trench isolation structure 18 may be formed the trench TR, and a first dielectric structure DS1 may be formed on the semiconductor substrate 10 after the step of forming the trench isolation structure 18. A portion of the first dielectric structure DS1 may be sandwiched between the first semiconductor channel layer 16A and the second semiconductor channel layer 16B in the horizontal direction D1, another portion of the first dielectric structure DS1 may be sandwiched between the first sacrificial pattern 12A and the second sacrificial pattern 12B in the horizontal direction D1, and further another portion of the first dielectric structure DS1 may be sandwiched between the first portion 14A and the second portion 14B of the second sacrificial layer 14 in the horizontal direction D1. In some embodiments, the first dielectric structure DS1 may directly contact the first sacrificial pattern 12A, the second sacrificial pattern 12B, the first semiconductor channel layer 16A, the second semiconductor channel layer 16B, and the first portion 14A and the second portion 14B of the second sacrificial layer 14, and the first dielectric structure DS1 may include the dielectric layer 22 and the dielectric layer 24 described above, but not limited thereto. In some embodiments, the dielectric layer 22 may be formed conformally on surfaces of the first sacrificial pattern 12A, the second sacrificial pattern 12B, the first semiconductor channel layer 16A, the second semiconductor channel layer 16B, the second sacrificial layer 14, and the trench isolation structure 18, the dielectric layer 24 may then be formed on the dielectric layer 22, and an etching back process may be performed to the dielectric layer 24 and the dielectric layer 22 after the dielectric layer 24 is formed on the dielectric layer 22 for removing a part of the dielectric layer 24 and a part of the dielectric layer 22 and forming the first dielectric structure DS1, but not limited thereto.

As shown in FIG. 6 and FIG. 7, after the step of forming the first dielectric structure DS1, the first sacrificial pattern 12A and the second sacrificial pattern 12B may be removed for forming a gap G between the bottommost second sacrificial layer 14 and the semiconductor substrate 10. In some embodiments, an isotropic etching process with relatively high etching selectivity (such as a wet etching process, but not limited thereto) may be used to remove the first sacrificial pattern 12A and the second sacrificial pattern 12B with the above-mentioned material composition difference between the first sacrificial layer 12 and the second sacrificial layer 14 for reducing etching damage to other material layers during the process of removing the first sacrificial pattern 12A and the second sacrificial pattern 12B, but not limited thereto. Subsequently, as shown in FIG. 7 and FIG. 8, a dielectric material 26 may be formed on the semiconductor substrate 10, the dielectric material 26 may cover the first dielectric structure DS1, the second sacrificial layers 14, the semiconductor layers 16, and the trench isolation structure 18, and the gap G described above may be filled with the dielectric material 26. In some embodiments, the gap G may be fully filled with the dielectric material 26, but not limited thereto. As shown in FIG. 8 and FIG. 9, an etching back process may be performed to the dielectric material 26 for removing a part of the dielectric material 26, forming a second dielectric structure DS2 between the first portion 14A of the bottommost second sacrificial layer 14 and the semiconductor substrate 10, and forming a third dielectric structure DS1 between the second portion 14B of the bottommost second sacrificial layer 14 and the semiconductor substrate 10. In other words, the second dielectric structure DS2 and the third dielectric structure DS3 may be different portions of the dielectric material 26, and the material composition of the second dielectric structure DS2 may be identical to the material composition of the third dielectric structure DS3.

In addition, the first portion 14A of the bottommost second sacrificial layer 14 may be sandwiched between the first semiconductor channel layer 16A and the second dielectric structure DS2 in the vertical direction D3, and the second portion 14B of the bottommost second sacrificial layer 14 may be sandwiched between the second semiconductor channel layer 16B and the third dielectric structure DS3 in the vertical direction D3. The second dielectric structure DS2 and the third dielectric structure DS3 may be directly connected with the first dielectric structure DS1. As shown in FIGS. 6-9, the method of forming the isolation structure S1 in this embodiment may include replacing the first sacrificial pattern 12A with the second dielectric structure DS2 and replacing the second sacrificial pattern 12B with the third dielectric structure DS3. The second dielectric structure DS2 may be the first horizontal portion S12 of the isolation structure S1 described above, the third dielectric structure DS3 may be the second horizontal portion S13 of the isolation structure S1, and the first dielectric structure DS1 may be the vertical portion S11 of the isolation structure S1, but not limited thereto. In addition, the method of forming the first dielectric structure DS1, the second dielectric structure DS2, and the third dielectric structure DS3 or the manufacturing method of the isolation structure S1 may include but is not limited to the manufacturing steps in FIGS. 5-9 described above, and other suitable approaches may be used to form the first dielectric structure DS1, the second dielectric structure DS2, and the third dielectric structure DS3 according to some design considerations.

As shown in FIG. 9 and FIG. 2, after the step of forming the second dielectric structure DS2 and the third dielectric structure DS3, the first gate structure GS1 and the second gate structure GS2 described above may be formed above the semiconductor substrate 10, the first gate structure GS1 and the second gate structure GS2 may be partly disposed above the first dielectric structure DS1, and the first gate structure GS1 and the second gate structure GS2 may be connected with each other. As shown in FIGS. 9-10, in some embodiments, after the step of forming the second dielectric structure DS2 and the third dielectric structure DS3, a dummy gate structure 28 may be formed above the first semiconductor channel layers 16A, the second semiconductor channel layers 16B, and the first dielectric structure DS1, and the dummy gate structure 28 may include polysilicon, amorphous silicon, or other suitable materials. After the step of forming the dummy gate structure 28, the spacer structure 30 may be formed above the semiconductor substrate 10, and a portion of the spacer structure 30 may be located on a sidewall of the dummy gate structure 28. After the step of forming the spacer structure 30, the first portions 14A and the second portions 14B of the second sacrificial layer 14 may be replaced with spacer layers 32A and spacer layers 32B. Therefore, the spacer layers 32A and the first semiconductor channel layers 16A may be disposed alternately on the second dielectric structure DS2 in the vertical direction D3, and the spacer layers 32B and the second semiconductor channel layers 16B may be disposed alternately on the third dielectric structure DS3 in the vertical direction D3. In some embodiments, the spacer layer 32A and the spacer layer 32B may be different portions of a spacer material 32 and may have the same material composition accordingly. The material composition of the spacer material 32 may be different from that of the first dielectric structure DS1, the second dielectric structure DS2, the third dielectric structure DS3, and the semiconductor layer 16, and the spacer material 32 may include an oxide insulating material or other suitable spacer materials, for example, but not limited thereto.

As shown in FIG. 10 and FIG. 13, the dummy gate structure 28, the spacer layers 32A, and the spacer layers 32B may be removed for exposing the first semiconductor channel layers 16A, the second semiconductor channel layers 16B, the first dielectric structure DS1, the second dielectric structure DS2, and the third dielectric structure DS3. Subsequently, the interfacial layer 38 may be formed conformally on the spacer structure 30, the trench isolation structure 18, the first semiconductor channel layers 16A, the second semiconductor channel layers 16B, the first dielectric structure DS1, the second dielectric structure DS2, and the third dielectric structure DS3, the dielectric layer 40 may be formed conformally on the interfacial layer 38, and the first work function layer 42 may be formed conformally on the dielectric layer 40. As shown in FIG. 13 and FIG. 2, in some embodiments, a portion of the first work function layer 42 (such as the first work function layer 42 on the first semiconductor channel layers 16A and the second dielectric structure DS2) may be removed, and the second work function layer 44 and the electrically conductive layer 46 may be formed after the portion of the first work function layer 42 is removed. A removing process (such as a chemical mechanical polishing process, but not limited thereto) may then be performed to remove a portion of the interfacial layer 38, a portion of the dielectric layer 40, a portion of the first work function layer 42, a portion of the second work function layer 44, an a portion of the electrically conductive layer 46 for forming the first gate structure GS1 and the second gate structure GS2.

As shown in FIG. 10 and FIG. 11, FIG. 11 may be a cross-sectional schematic diagram illustrating the portion located corresponding to the position where the source/drain structure is formed in the subsequent process. In some embodiments, after the step of forming the spacer layers 32A and the spacer layers 32B, another portion of the spacer structure 30 may be located on sidewalls of the spacer layers 32A, the spacer layers 32B, the first semiconductor channel layers 16A, the second semiconductor channel layers 16B, the second dielectric structure DS2, and the third dielectric structure DS3. As shown in FIG. 11 and FIG. 12, the spacer layers 32A and the spacer layers 32B may be removed. After the step of removing the spacer layers 32A and the spacer layers 32B, the first source/drain structure 34A may be formed above the second dielectric structure DS2, and the second source/drain structure 34B may be formed above the third dielectric structure DS3. A portion of the first dielectric structure DS1 may be located between the first source/drain structure 34A and the second source/drain structure 34B in the horizontal direction D1, and a portion of the spacer structure 30 may be located on the sidewall of the first source/drain structure 34A and the sidewall of the second source/drain structure 34B. In some embodiments, the manufacturing step corresponding to FIG. 12 may be performed after the manufacturing step corresponding to FIG. 10 and before the manufacturing step corresponding to FIG. 13. Therefore, the first source/drain structure 34A and the second source/drain structure 34B may be formed before the step of forming the first gate structure and the second gate structure, and the dummy gate structure 28 illustrated in FIG. 10 may be formed before the step of forming the first source/drain structure 34A and the second source/drain structure 34B illustrated in FIG. 12.

As shown in FIG. 12 and FIG. 3, the dielectric layer 36 may be formed covering the spacer structure 30, the first source/drain structure 34A, the second source/drain structure 34B, and a portion of the first dielectric structure DS1. In some embodiments, the manufacturing step corresponding to FIG. 13 may be performed after the manufacturing step corresponding to FIG. 3, and the dummy gate structure 28, the spacer layers 32A, and the spacer layers 32B illustrated in FIG. 10 may be removed after the step of forming the dielectric layer 36 illustrated in FIG. 3. In other words, after the spacer structure 30, the first source/drain structure 34A, the second source/drain structure 34B, and the dielectric layer 36 area formed, the dummy gate structure 28 may be removed, and the first gate structure GS1 and the second gate structure GS2 may then be formed. It is worth noting that, the method of forming the first gate structure GS1, the second gate structure GS2, the first source/drain structure 34A, and the second source/drain structure 34B in this embodiment may include but is not limited to the manufacturing steps described above in FIGS. 10-13, FIG. 2, and FIG. 3. Therefore, the first gate structure GS1, the second gate structure GS2, the first source/drain structure 34A, and the second source/drain structure 34B may be formed by other suitable approaches according to some design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 14:
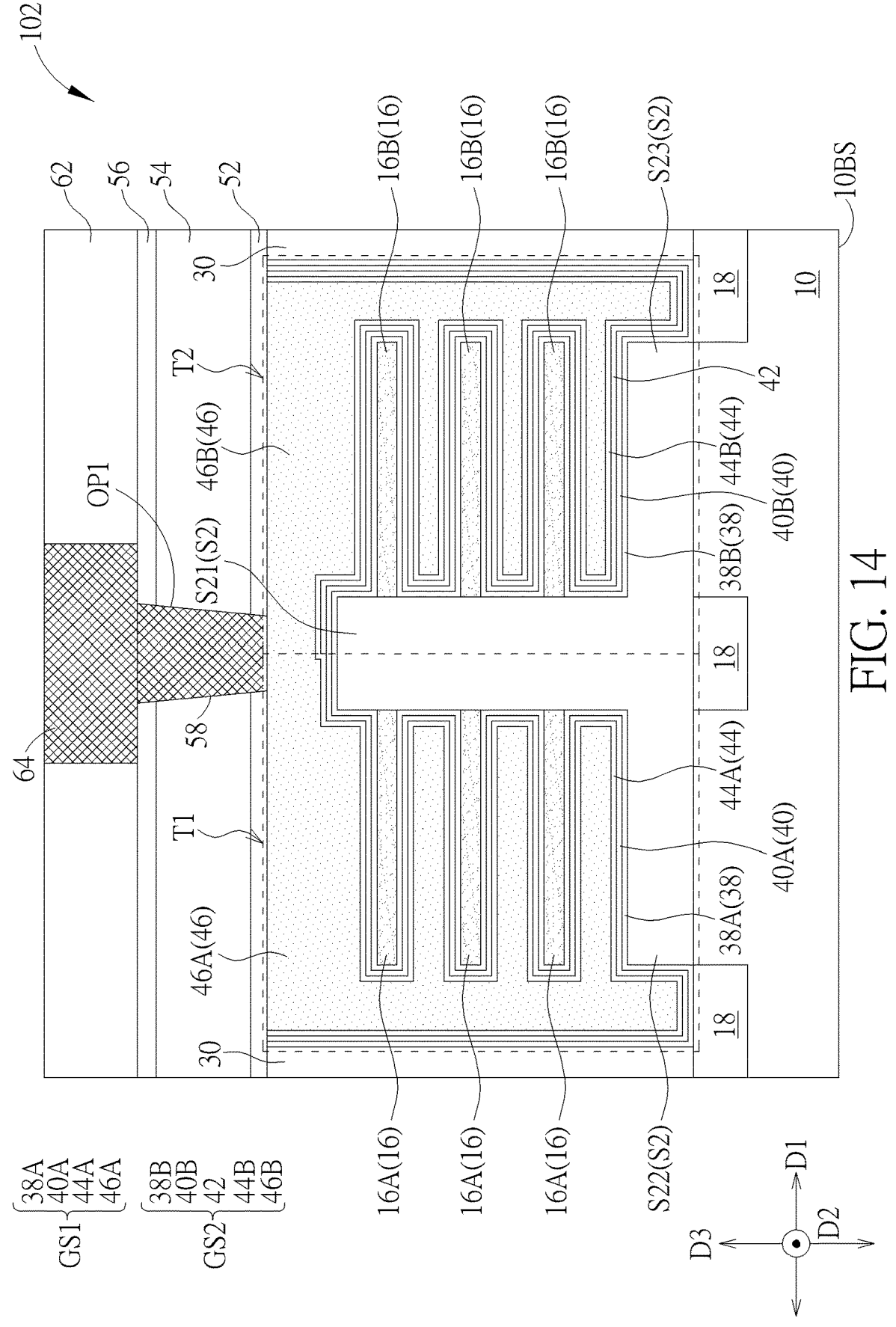
FIG. 14 is a cross-sectional schematic diagram illustrating a semiconductor device according to a second embodiment of the present invention.
Figure 15:
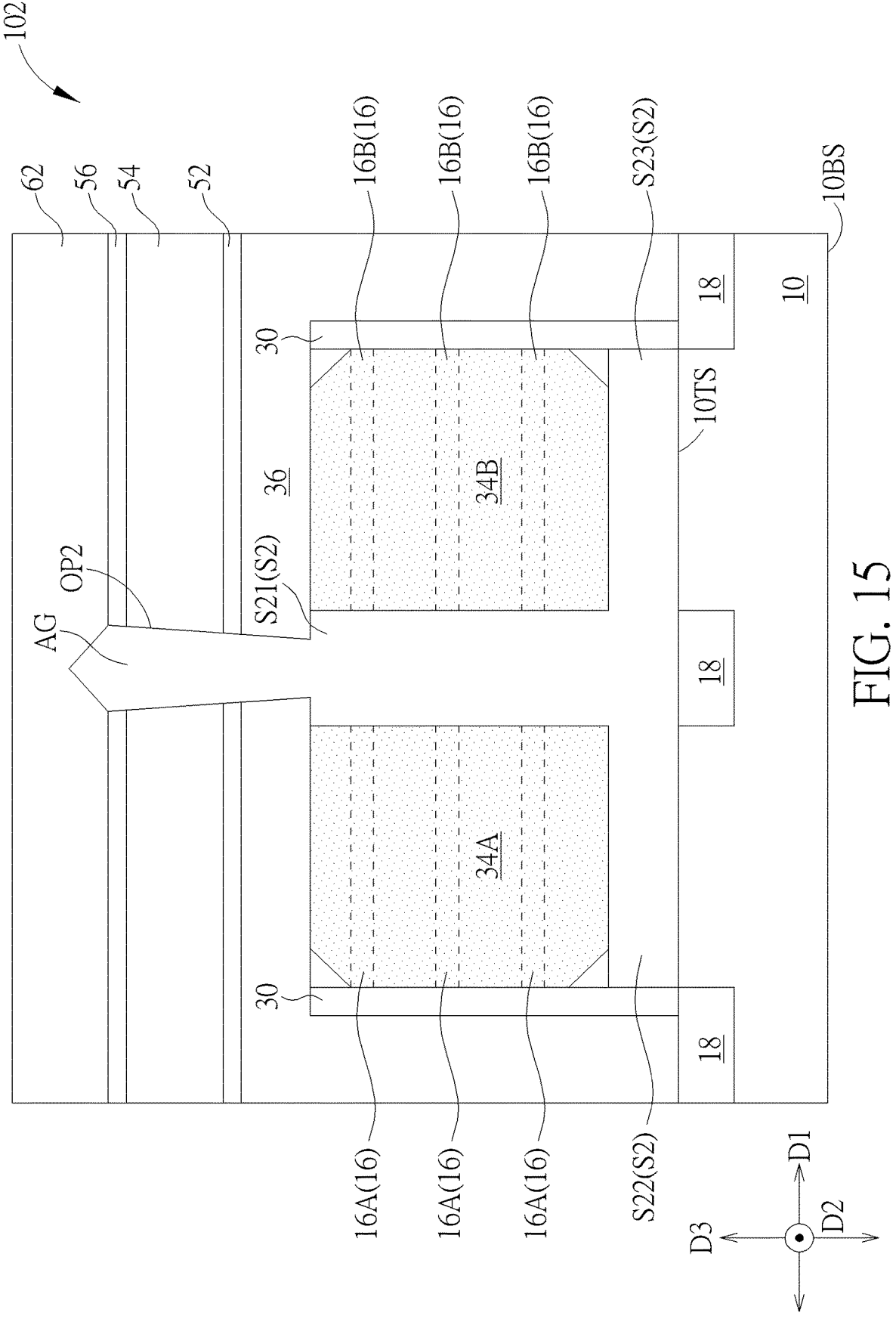
FIG. 15 is another cross-sectional schematic diagram illustrating the semiconductor device according to the second embodiment of the present invention.

Please refer to FIG. 14 and FIG. 15. FIG. 14 is a cross-sectional schematic diagram illustrating a semiconductor device 102 according to a second embodiment of the present invention, and FIG. 15 is another cross-sectional schematic diagram illustrating the semiconductor device 102 in this embodiment. In some embodiments, a position of a cross-sectional line corresponding to FIG. 14 in a top view diagram of the semiconductor device 102 may be similar to the position of the cross-sectional line corresponding to FIG. 2 in FIG. 1, and a position of a cross-sectional line corresponding to FIG. 15 in the top view diagram of the semiconductor device 102 may be similar to the position of the cross-sectional line corresponding to FIG. 3 in FIG. 1, but not limited thereto. As shown in FIG. 14 and FIG. 15, the semiconductor device 102 includes the semiconductor substrate 10, the first semiconductor channel layer 16A, the second semiconductor channel layer 16B, and an isolation structure S2. The first semiconductor channel layer 16A, the second semiconductor channel layer 16B, and the isolation structure S2 are disposed above the semiconductor substrate 10 in the vertical direction D3. The isolation structure S2 includes a vertical portion S21, a first horizontal portion S22, and a second horizontal portion S23. The vertical portion S21 is disposed between the first semiconductor channel layer 16A and the second semiconductor channel layer 16B in the horizontal direction D1. The first horizontal portion S22 is disposed between the first semiconductor channel layer 16A and the semiconductor substrate 10 in the vertical direction D3. The second horizontal portion S23 is disposed between the second semiconductor channel layer 16B and the semiconductor substrate 10 in the vertical direction D3. The first horizontal portion S22 and the second horizontal portion S23 are connected with the vertical portion S21. The difference between the semiconductor device 102 in this embodiment and the semiconductor device 101 in the first embodiment described above is that the vertical portion S21, the first horizontal portion S22, and the second horizontal portion S23 of the isolation structure S2 in the semiconductor device 102 may be air voids for further lowering the equivalent dielectric constant of the isolation structure S2 (the dielectric constant of air is about 1) and improving the isolation performance of the isolation structure S2. For example, the vertical portion S21 may be an air void for reducing parasitic capacitance between the first semiconductor channel layer 16A and the second semiconductor channel layer 16B, and the first horizontal portion S22 and the second horizontal portion S23 may be air voids for further reducing off current of the transistor T1 and the transistor T2 in the semiconductor device 102 and improving the subthreshold swing of the transistor T1 and the transistor T2. In some embodiments, the isolation structure S2 may consist of air voids without including other materials, but not limited thereto. In addition, the relative relationship between the isolation structure S2 and other parts in the semiconductor device 102 may be identical to the relative relationship between the isolation structure S1 and other parts in the semiconductor device 101 as illustrated in FIGS. 1-3, but not limited thereto.

As shown in FIG. 14 and FIG. 15, the semiconductor device 102 may further include an etching stop layer 52, a dielectric layer 54, an etching stop layer 56, a contact structure 58, a dielectric layer 62, and an electrically conductive layer 64. The etching stop layer 52 is disposed on the first gate structure GS1, the second gate structure GS2, the spacer structure 30, and the dielectric layer 36. The dielectric layer 54 is disposed on the etching stop layer 52. The etching stop layer 56 is disposed on the dielectric layer 54, and the dielectric layer 62 is disposed on the etching stop layer 56. The contact structure 58 is disposed in an opening OP1 penetrating through the etching stop layer 56, the dielectric layer 54, and the etching stop layer 52 for contacting and being electrically connected with the first gate structure GS1 and/or the second gate structure GS2, and the electrically conductive layer 64 may be disposed on the dielectric layer 62 and connected with the contact structure 58. The etching stop layer 52 and the etching stop layer 56 may include silicon nitride or other suitable dielectric materials, the dielectric layer 54 and the dielectric layer 62 may include silicon oxide, silicon oxynitride, a low-k dielectric material, or other suitable dielectric materials, and the contact structure 58 and the electrically conductive layer 64 may include a barrier layer (not illustrated) and an electrically conductive material (not illustrated) disposed on the barrier layer, but not limited thereto. The barrier layer described above may include titanium nitride, tantalum nitride, or other suitable barrier materials, and the electrically conductive material described above may include materials with relatively low electrical resistivity, such as tungsten, aluminum, copper, titanium aluminide, titanium, and so forth, but not limited thereto. In some embodiments, the semiconductor device 102 may further include an air void AG and an opening OP2, the opening OP2 may penetrate through the etching stop layer 56, the dielectric layer 54, the etching stop layer 52, and the dielectric layer 36 located on the vertical portion S21 of the isolation structure S2 in the vertical direction D3, and the air void AG may be disposed in the opening OP2. The air void AG may be located on the vertical portion S21 of the isolation structure S2 connected with the first source/drain structure 34A and the second source/drain structure 34B, and the air void AG may be directly connected with the vertical portion S21 which is an air void also. In some embodiments, the air void AG may extend upwards in the vertical direction D3 for being partly located in the dielectric layer 62, and the air void AG does not penetrate through the whole dielectric layer 62.

Figure 16:
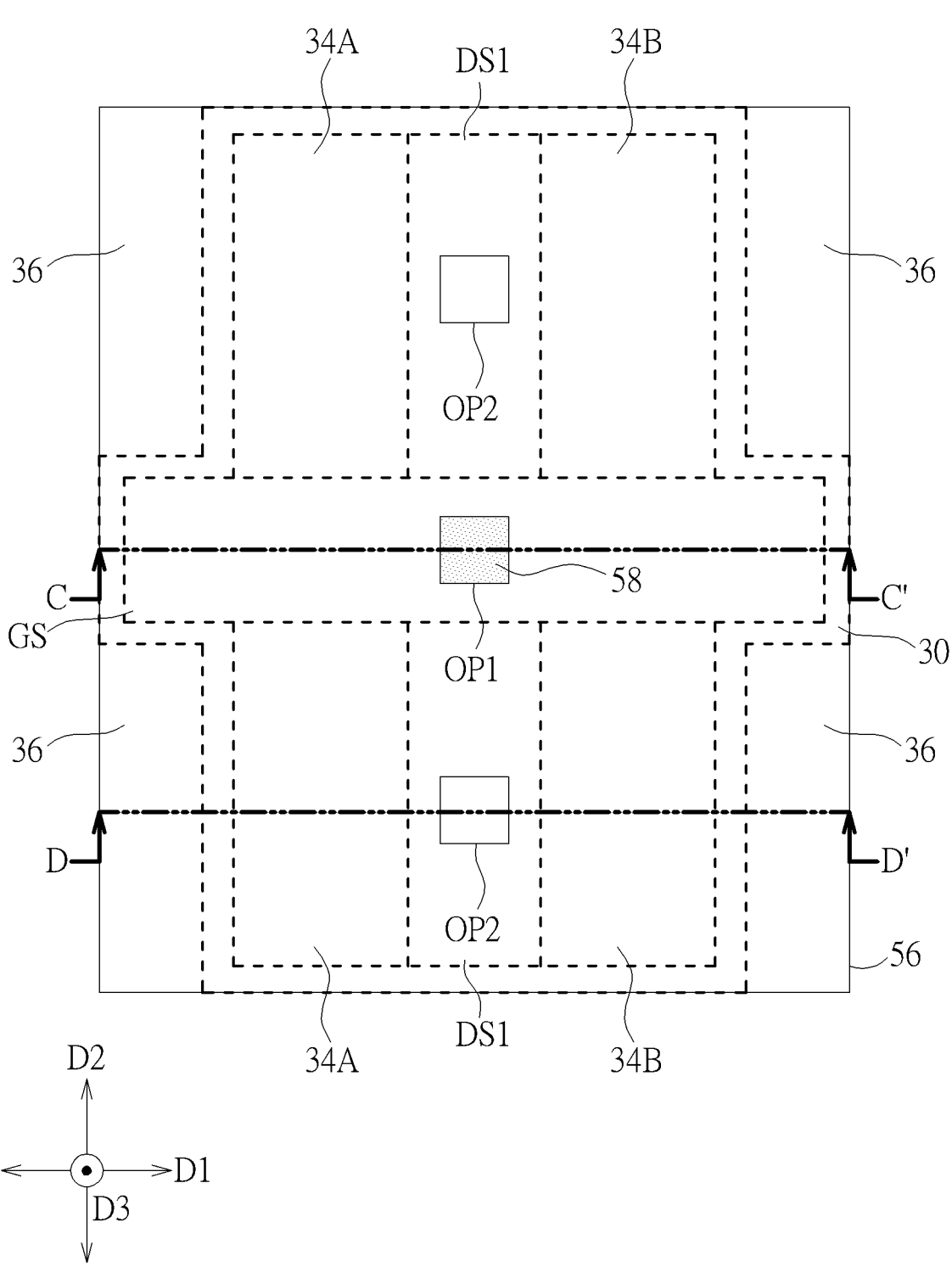
Figure 17:
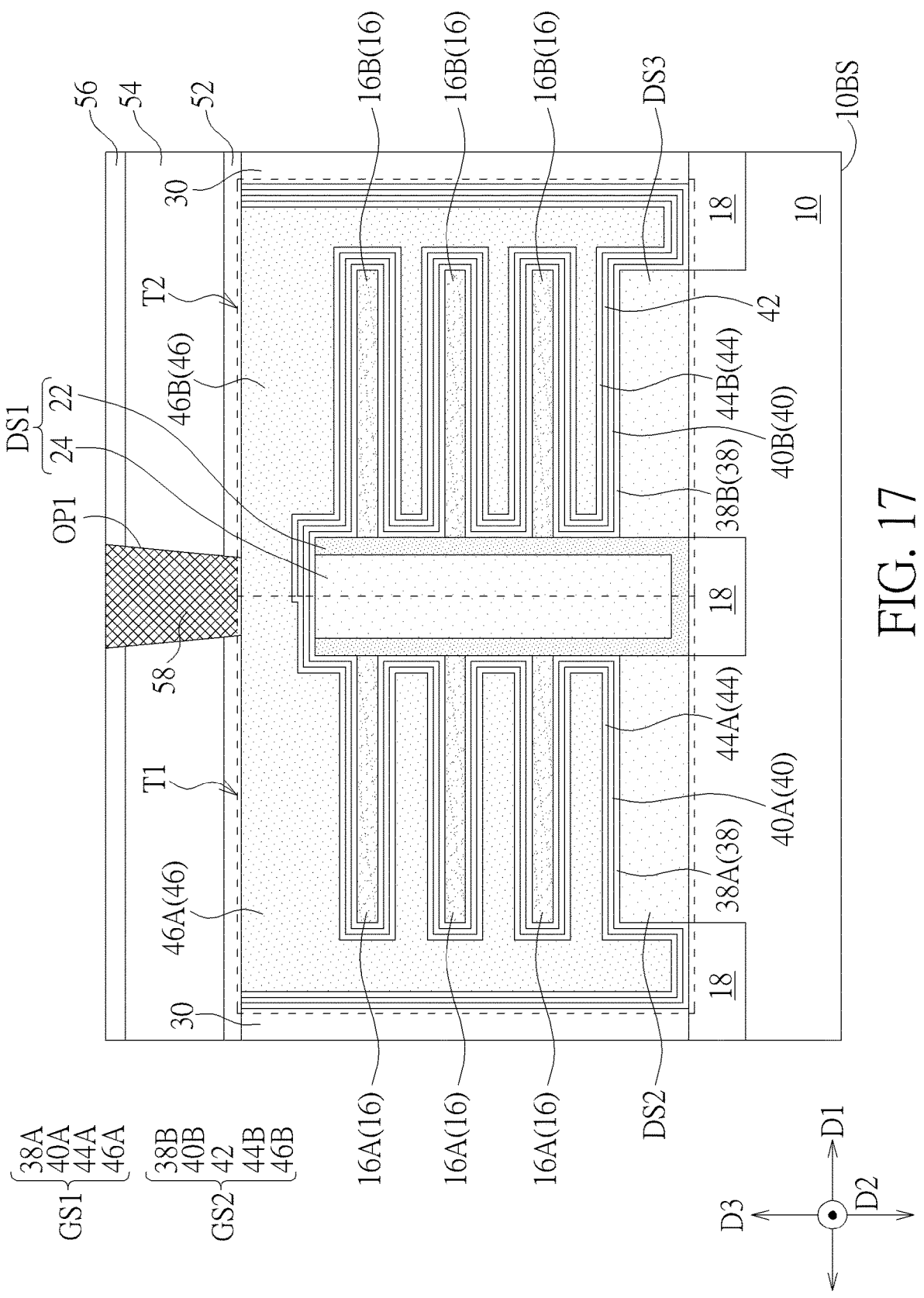
Figure 18:
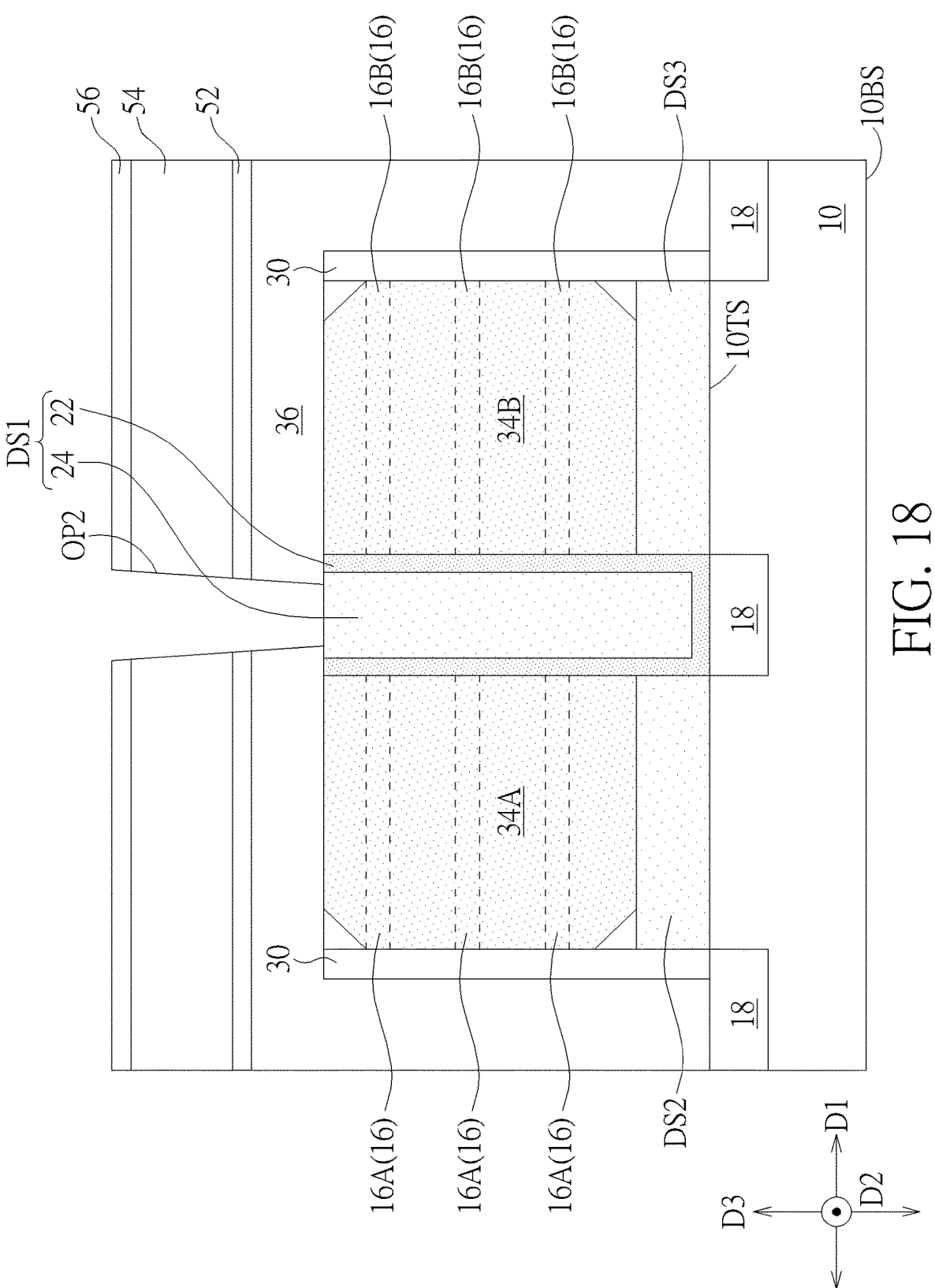

Please refer to FIGS. 14-18 and FIGS. 1-3. FIGS. 16-18 are schematic drawings illustrating a manufacturing method of a semiconductor device according to another embodiment of the present invention, wherein FIG. 17 is a cross-sectional schematic diagram taken along a line C-C' in FIG. 16, and FIG. 18 is a cross-sectional schematic diagram taken along a line D-D' in FIG. 16. In some embodiments, FIG. 17 may be regarded as a schematic drawing in a step subsequent to FIG. 2, FIG. 18 may be regarded as a schematic drawing in a step subsequent to FIG. 3, FIG. 14 may be regarded as a schematic drawing in a step subsequent to FIG. 17, and FIG. 15 may be regarded as a schematic drawing in a step subsequent to FIG. 18, but not limited thereto. As shown in FIG. 2, FIG. 3, and FIGS. 16-18, in the manufacturing method in this embodiment, after the step of forming the first gate structure GS1 and/or the second gate structure GS2, the etching stop layer 52, the dielectric layer 54, and the etching stop layer 56 may be formed, and the opening OP1 and two openings OP2 may be formed. The opening OP1 may be located on the first gate structure GS1 and/or the second gate structure GS2, and the two openings OP2 may be located at two opposite sides of the opening OP1 in the horizontal direction D2. The opening OP2 may be located on the first dielectric structure DS1 and expose at least a part of the first dielectric structure DS1, and the contact structure 58 may be formed in the opening OP1.

Subsequently, as shown in FIGS. 16-18, FIG. 14, and FIG. 15, a removing process may be performed for removing the first dielectric structure DS1, the second dielectric structure DS2, and the third dielectric structure DS3 for forming the isolation structure S2 which is an air void or air voids. In some embodiments, the removing process described above may include a wet etching process with relatively high etching selectivity for etching the first dielectric structure DS1 exposed by the openings OP2 and removing the first dielectric structure DS, the second dielectric structure DS2, and the third dielectric structure DS3 together via the openings OP2. In addition, the material composition of the interfacial layer 38 may be different from that of the first dielectric structure DS, the second dielectric structure DS2, and the third dielectric structure DS3 for reducing damage to and/or other negative influence on the interfacial layer 38 and other material layers in the removing process described above, but not limited thereto. Subsequently, the dielectric layer 62 and the electrically conductive layer 64 may be formed. The material of the dielectric layer 62 may be kept from being formed in the opening OP2 and the air void under the opening OP2 and/or the material of the dielectric layer 62 formed in the opening OP2 and the air void under the opening OP2 may be reduced by controlling the dimension of the opening OP2 and/or forming the dielectric layer 62 by a manufacturing process with poor gap filling performance. In this situation, the air void AG formed in the opening OP2 may extend upwards and be located partly in the dielectric layer 62, and the topmost portion of the air void AG may be higher than the bottom surface of the dielectric layer 62 and the top surface of the etching stop layer 56 in the vertical direction D3 accordingly, but not limited thereto. It is worth noting that, the manufacturing method of the isolation structure S2 in the semiconductor device 102 may include but is not limited to the steps described above, and the vertical portion S21, the first horizontal portion S22, and the second horizontal portion S23 of the isolation structure S2 may be air voids and may be formed by other suitable manufacturing approaches according to other design considerations.

To summarize the above descriptions, according to the semiconductor device and the manufacturing method thereof in the present invention, the isolation structure including the vertical portion and the horizontal portions may be disposed on the semiconductor substrate for forming isolation between different transistor structures and reducing the off current of the semiconductor device, and the related operation performance of the semiconductor device may be improved accordingly. Additionally, in some embodiments, the vertical portion and the horizontal portions of the isolation structure may be air voids for further enhancing the isolation performance of the isolation structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a first semiconductor channel layer disposed above the semiconductor substrate;
   a second semiconductor channel layer disposed above the semiconductor substrate;
   an isolation structure disposed above the semiconductor substrate, wherein the isolation structure comprises:
   a vertical portion disposed between the first semiconductor channel layer and the second semiconductor channel layer in a horizontal direction;
   a first horizontal portion disposed between the first semiconductor channel layer and the semiconductor substrate in a vertical direction; and
   a second horizontal portion disposed between the second semiconductor channel layer and the semiconductor substrate in the vertical direction, wherein the first horizontal portion and the second horizontal portion are connected with the vertical portion;
   a first gate structure disposed above the semiconductor substrate and encompassing the first semiconductor channel layer; and
   a second gate structure disposed above the semiconductor substrate and encompassing the second semiconductor channel layer, wherein the first gate structure and the second gate structure are partly disposed above the vertical portion of the isolation structure, and the first gate structure and the second gate structure are connected with each other.
2. The semiconductor device according to claim 1, wherein a material composition of the vertical portion is different from a material composition of the first horizontal portion and a material composition of the second horizontal portion.

3. The semiconductor device according to claim 1, wherein the vertical portion, the first horizontal portion, and the second horizontal portion are air voids.

4. The semiconductor device according to claim 1, wherein a material composition of the first gate structure is different from a material composition of the second gate structure.

5. The semiconductor device according to claim 1, further comprising:

a first source/drain structure disposed above the first horizontal portion of the isolation structure; and a second source/drain structure disposed above the second horizontal portion of the isolation structure, wherein the vertical portion of the isolation structure is partly disposed between the first source/drain structure and the second source/drain structure in the horizontal direction.

6. The semiconductor device according to claim 5, wherein a material composition of the first source/drain structure is different from a material composition of the second source/drain structure.

7. The semiconductor device according to claim 5, further comprising:

a spacer structure disposed above the semiconductor substrate, wherein the spacer structure is located on a sidewall of the first gate structure, a sidewall of the second gate structure, a sidewall of the first source/ drain structure, and a sidewall of the second source/ drain structure.

8. The semiconductor device according to claim 7, wherein a portion of the first gate structure is sandwiched between the spacer structure and the first horizontal portion of the isolation structure in the horizontal direction, and a portion of the second gate structure is sandwiched between the spacer structure and the second horizontal portion of the isolation structure in the horizontal direction.

9. The semiconductor device according to claim 1, wherein the first semiconductor channel layer and the second semiconductor channel layer are directly connected with the vertical portion of the isolation structure.

* * * * *